US008063661B2

(12) United States Patent
Ishihara et al.

(10) Patent No.: US 8,063,661 B2
(45) Date of Patent: Nov. 22, 2011

(54) SEMICONDUCTOR DEVICE HAVING CIRCUIT BLOCKS WITH MUTUALLY THE SAME CIRCUIT CONFIGURATION

(75) Inventors: Takashi Ishihara, Tokyo (JP); Minoru Yamagami, Tokyo (JP); Hisayuki Nagamine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/820,544

(22) Filed: Jun. 22, 2010

(65) Prior Publication Data
US 2010/0327966 A1  Dec. 30, 2010

(30) Foreign Application Priority Data

Jun. 24, 2009  (JP) .................................. 2009-149750

(51) Int. Cl.
*H01L 25/00* (2006.01)
(52) U.S. Cl. ............................. 326/41; 326/47; 326/101
(58) Field of Classification Search .............. 326/37–41, 326/47, 101
See application file for complete search history.

(56) References Cited

U.S. PATENT DOCUMENTS
2005/0237083 A1* 10/2005 Bakker et al. .................. 326/47

FOREIGN PATENT DOCUMENTS
JP  2001-043695 A  2/2001
JP  2006-237642 A  9/2006

* cited by examiner

Primary Examiner — Shawki S Ismail
Assistant Examiner — Thienvu Tran
(74) Attorney, Agent, or Firm — Sughrue Mion, PLLC

(57) ABSTRACT

To include a plurality of circuit blocks each including a plurality of nonvolatile memory elements arranged in the X direction, a plurality of comparing circuits that are respectively allocated to the nonvolatile memory elements, and a determining circuit that is commonly allocated to the comparing circuits. The nonvolatile memory elements included in a predetermined circuit block among the circuit blocks are arranged in a first area. The comparing circuits and the determining circuit included in the predetermined circuit block are arranged side by side in the X direction in a second area that is located in the Y direction with respect to the first area. With this arrangement, because the circuit block becomes a shaped block, even when a plurality of circuit blocks are repeatedly arranged, it is possible to realize a further reduction of the chip area.

23 Claims, 25 Drawing Sheets

SEMICONDUCTOR DEVICE HAVING CIRCUIT BLOCKS WITH MUTUALLY THE SAME CIRCUIT CONFIGURATION

BACKGROUND OF THE INVENTION

1. Field of the Invention

The present invention relates to a semiconductor device, and more particularly relates to a layout of a plurality of circuit blocks formed on a semiconductor substrate.

2. Description of Related Art

A semiconductor memory device such as a DRAM (Dynamic Random Access Memory) often includes a redundant circuit for saving a defective address in the device. As described in Japanese Patent Application Laid-open No. 2001-43695, the redundant circuit includes a fuse element that stores therein a defective address, a comparing circuit that compares an address stored in the fuse element with an address for which an access is requested, and a determining circuit that determines whether all bits of the address for which the access is requested match those of the defective address stored in the fuse element. When the determination result shows a match of all the bits, an alternative access is performed to a redundant word line or a redundant bit line instead of a defective word line or a defective bit line. With this method, an address assigned to the defective word line or the defective bit line is saved, so that the device is handled as a good chip.

As a well-known layout of a redundant circuit, there is a layout described in Japanese Patent Application Laid-open No. 2006-237642. In the patent document, as shown in FIG. 1 thereof, there is disclosed a layout in which a plurality of fuse elements are arranged in one direction and a plurality of comparing circuits corresponding to the fuse elements are arranged close to the fuse elements, respectively, in the same direction. A pitch of the comparing circuit array is set to be smaller than a pitch of the fuse element array, thus providing a space in the comparing circuit array, in which a common signal line required for a plurality of comparing circuits is arranged.

The application of the fuse elements is not limited to semiconductor memory devices, and the fuse elements are used in general semiconductor products such as a CPU (Central Processing Unit), an MCU (Micro Control Unit), a DSP (Digital Signal Processor), an ASIC (Application Specific Integrated Circuit), and an ASSP (Application Specific Standard Circuit). These products include a large number of fuse elements and processing circuits for processing signals from the fuse elements, which are compactly arranged in a predetermined area on a semiconductor substrate. A variety of systems are applied to the fuse elements, such as a technique of blowing a wiring with an optical laser, a technique of melting down a wiring with an electric fuse, and a technique of breaking down a gate insulating layer of a transistor or a PN junction with an antifuse.

However, because the layout described in Japanese Patent Application Laid-open No. 2006-237642 is for simply laying out wirings in a space obtained in a comparing circuit array, a determining circuit that collects a plurality of comparison result signals output from a plurality of comparing circuits respectively corresponding to fuse elements and generates a determination result signal indicating whether it is redundant or not should be laid out in a separate area. Because one determining circuit is required for a plurality of comparing circuits, in the layout described in Japanese Patent Application Laid-open No. 2006-237642, a plurality of determining circuits are arranged in a scattered manner along the direction of arranging the comparing circuits. As a result, the shape of the layout of the redundant circuit becomes an irregular shape that is wasteful, resulting in a problem of increasing a chip area.

The problems explained above are not limited to a redundant circuit of a semiconductor memory device, but are problems that usually occur in a semiconductor device that includes a plurality of circuit blocks formed on a semiconductor substrate in which each of the circuit blocks includes a plurality of unit circuits, a plurality of processing circuits each being allocated to each of the unit circuits, and a common circuit that is commonly allocated to a plurality of processing circuits.

SUMMARY

In one embodiment, there is provided a semiconductor device that includes a plurality of circuit blocks with a mutually same circuit configuration, wherein each of the circuit blocks has: a first sub-block in which a plurality of unit circuits are arranged in a first direction; a second sub-block including a plurality of processing circuits that are respectively allocated to the unit circuits, each of the processing circuits processing information obtained from a corresponding one of the unit circuits; and a third sub-block including a common circuit that is commonly allocated to the processing circuits, the common circuit outputting one result from information obtained from the processing circuits, the first sub-block included in a predetermined circuit block among the circuit blocks is arranged in a first area, and at least a part of the second sub-block included in the predetermined circuit block and either one of at least a part of the third sub-block included in the predetermined circuit block and at least a part of the third sub-block included in another sub-block not included in the predetermined circuit block are arranged side by side in the first direction in a second area that is located in a second direction that intersects with the first direction with respect to the first area.

According to the present invention, because unit circuits, processing circuits, and a common circuit belonging to one circuit block or two or more circuit blocks can be arranged in a shaped area, even when a plurality of circuit blocks are repeatedly arranged, it is possible to obtain a layout with no waste of space. Therefore, it is possible to obtain a downsized chip area as compared to conventional cases, and as a result, it is possible to achieve a low manufacturing cost.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Some representative examples of the technical concepts for solving the problem of the present invention are described below. Note that the claimed contents of the present invention are not limited to the technical concepts and these are defined by the descriptions in the claims of the present invention.

That is, according to the present invention, a technical concept of the present invention is that, among a unit circuit, a processing circuit, and a common circuit belonging to the same circuit block, the unit circuit is arranged in a first area, the processing circuit and the common circuit are arranged in a second area that is adjacent to the first area. This makes it possible to obtain a shaped block of one circuit block.

Furthermore, according to the present invention, another technical concept of the present invention is that a unit circuit, a processing circuit, and a common circuit belonging to the same circuit block are arranged in an L-shape and two paired circuit blocks are combined with each other. This makes it possible to obtain a shaped block of two circuit blocks.

Preferred embodiments of the present invention are explained below in detail with reference to the accompanying drawings.

Figure 1:
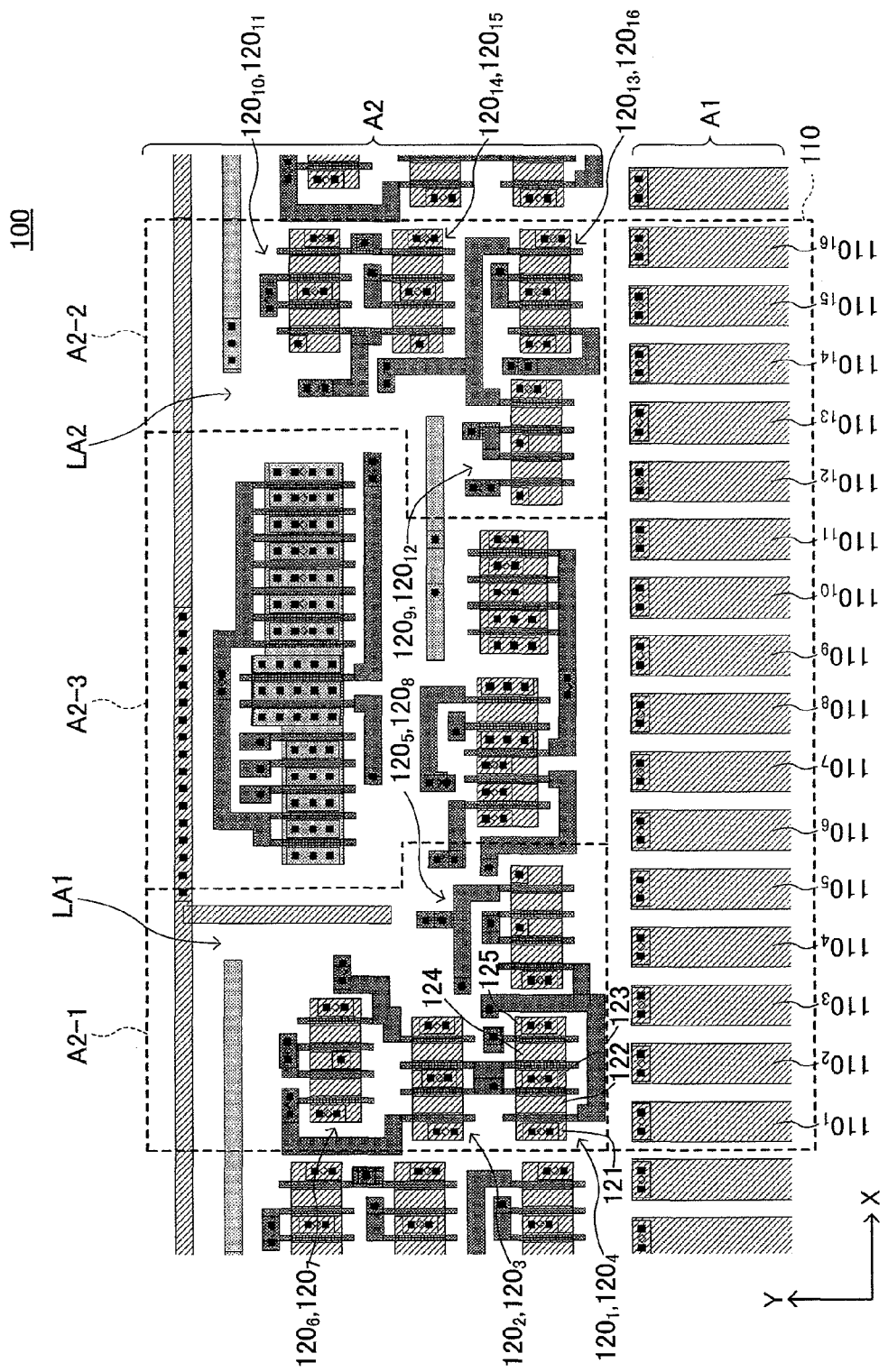
FIG. 1 is a layout diagram of a circuit block 100 included in a semiconductor device according to a first embodiment of the present invention.
Figure 2:
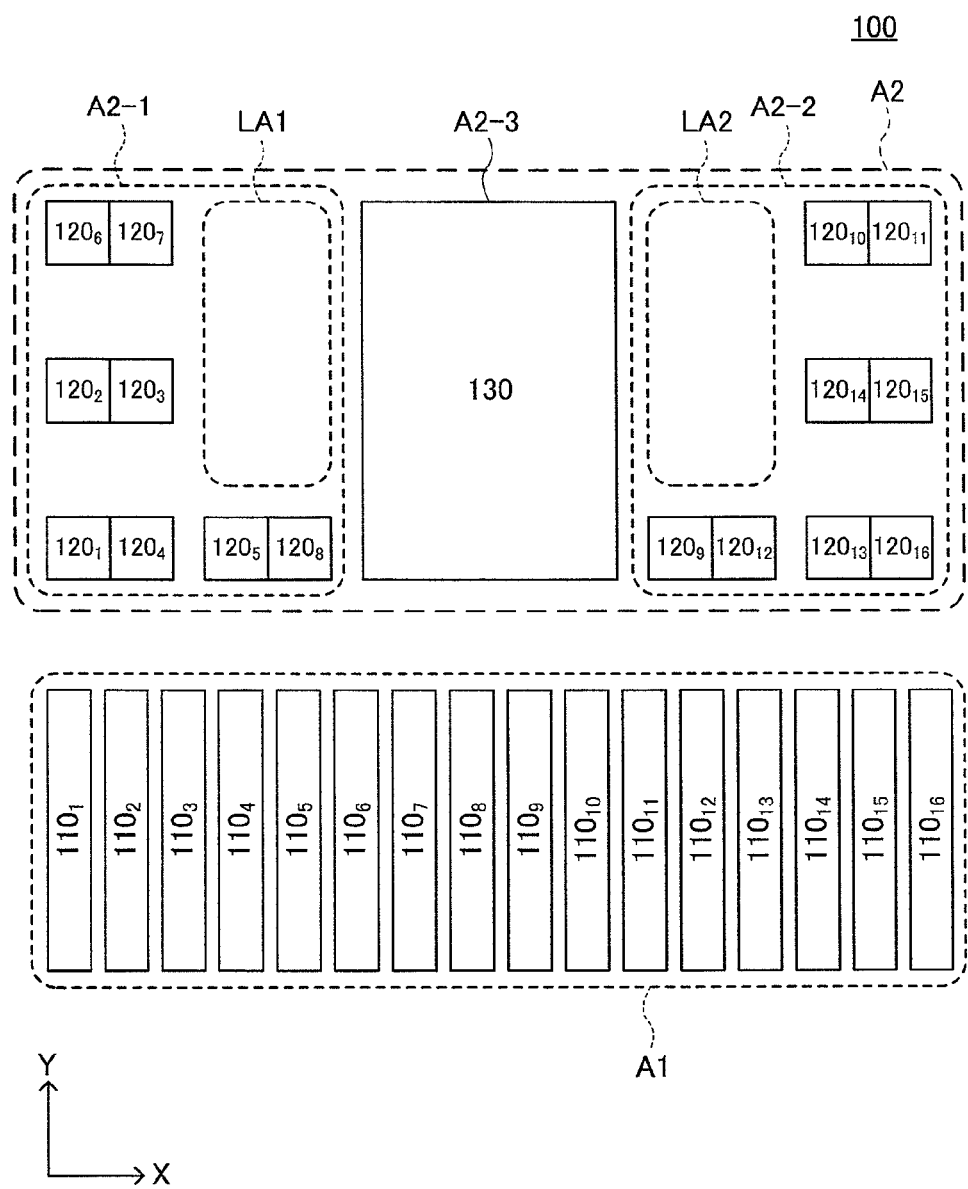
FIG. 2 is a schematic layout diagram of the circuit block 100 shown in FIG. 1.
Figure 3:
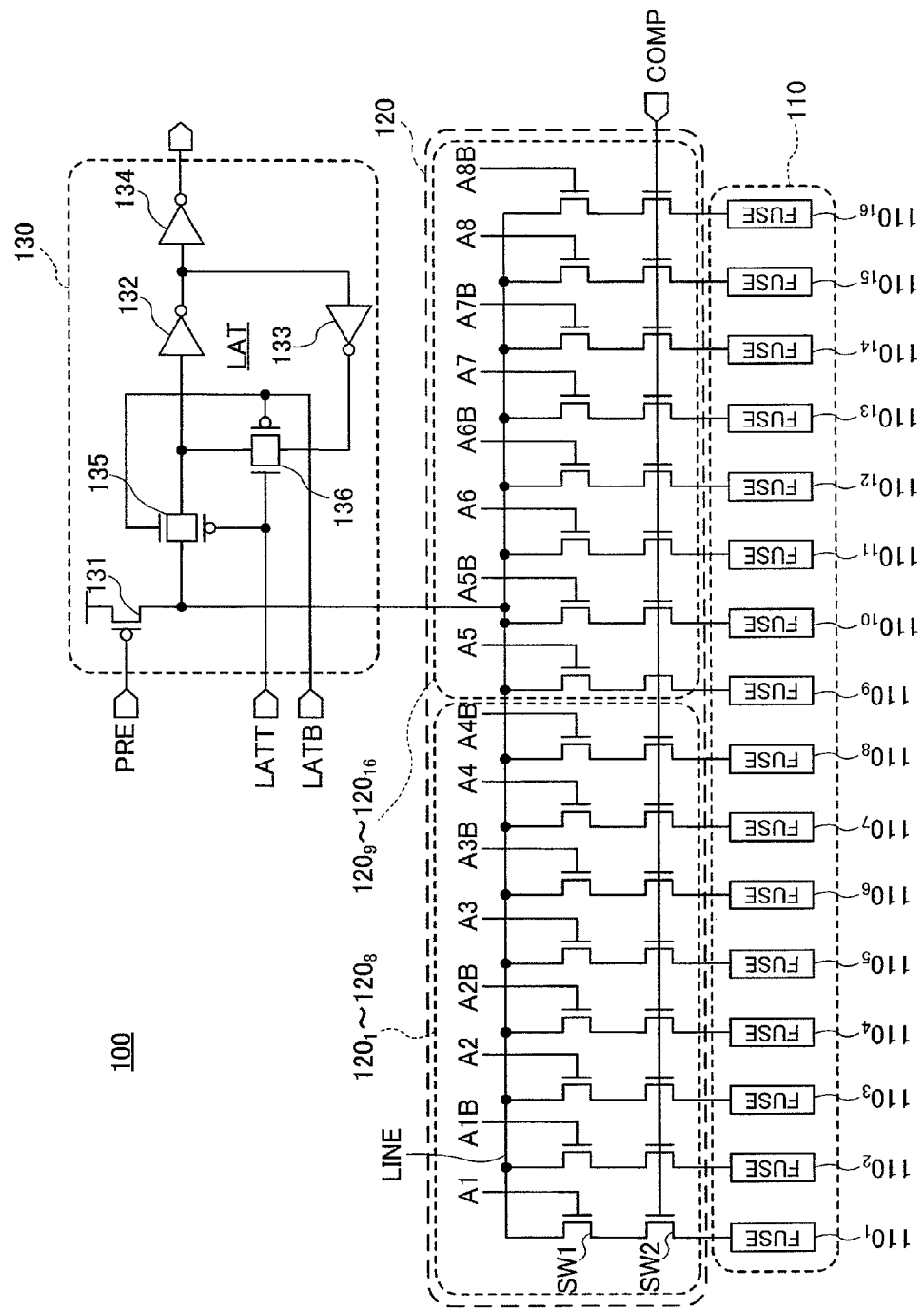
FIG. 3 is a circuit diagram of the circuit block 100 shown in FIG. 1.
Figure 25:
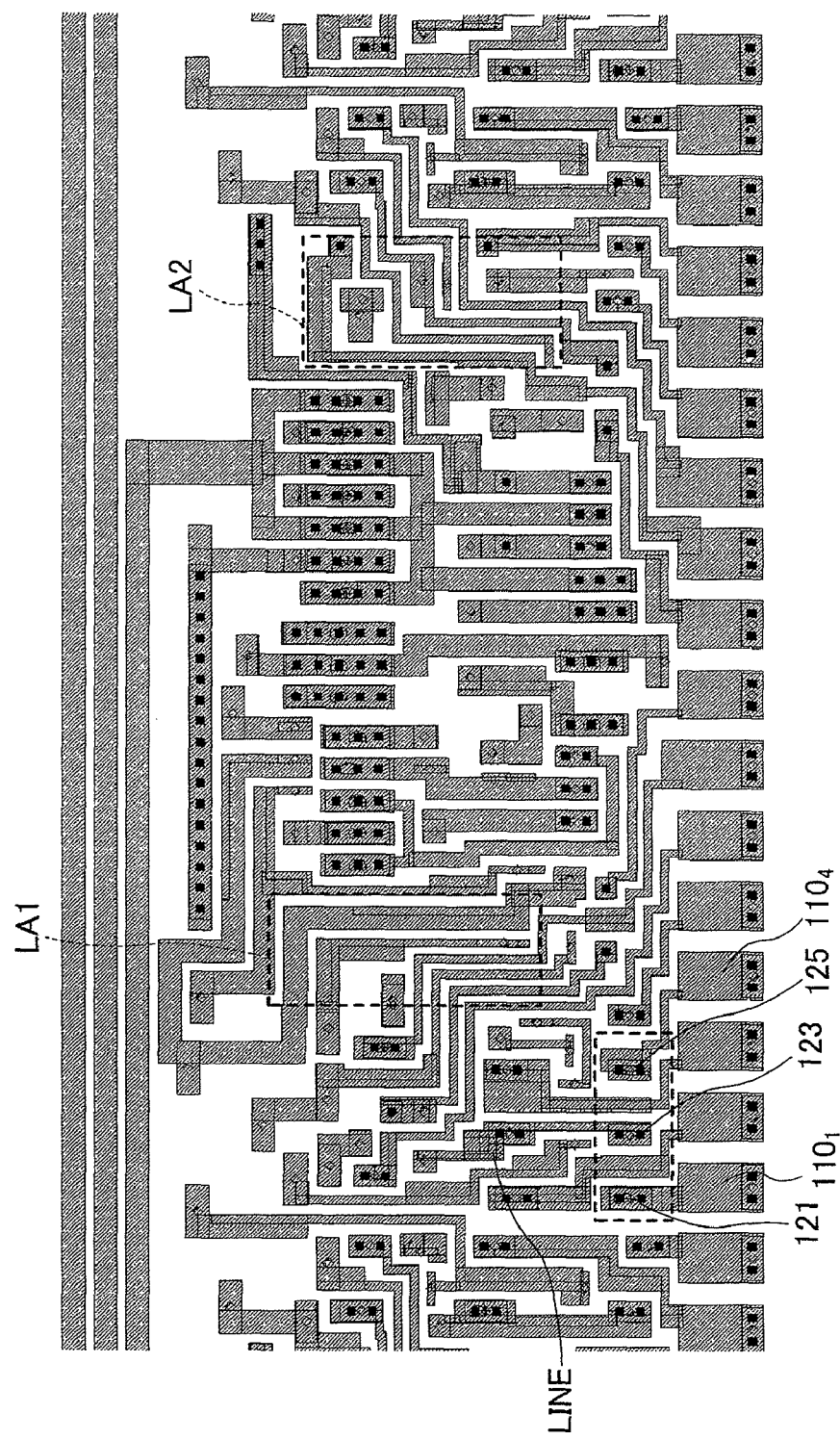
FIG. 25 a diagram showing an upper layer line corresponding to the layout shown in FIG. 1.

FIG. 1 is a layout diagram of a circuit block 100 included in a semiconductor device according to a first embodiment of the present invention, FIG. 2 is a schematic layout diagram of the circuit block 100 shown in FIG. 1, and FIG. 3 is a circuit diagram of the circuit block 100 shown in FIG. 1. In FIG. 1, a portion consisting of a diffusion layer and a gate line is shown. A part of an upper layer line corresponding to the layout shown in FIG. 1 is shown in FIG. 25. Black squares shown in FIGS. 1 and 25 are contact conductors through which the diffusion layer or the gate line and the upper layer line formed at corresponding positions are connected to each other.

The circuit block 100 shown in FIGS. 1 to 3 is a part of a redundant circuit, showing a portion corresponding to one address. The circuit block 100 is constituted by a plurality of nonvolatile memory elements $110_1$ to $110_{16}$, a plurality of comparing circuits $120_1$ to $120_{16}$ respectively allocated to the nonvolatile memory elements $110_1$ to $110_{16}$, and a determining circuit 130 commonly allocated to the comparing circuits $120_1$ to $120_{16}$. In the following explanations, when it is not necessary to specify a particular nonvolatile memory element or when collectively referring to all the nonvolatile memory elements, they may be simply referred to as "the nonvolatile memory element 110". Similarly, the same goes for the comparing circuits $120_1$ to $120_{16}$, and they may be simply referred to as "the comparing circuit 120".

The portion consisting of the nonvolatile memory elements $110_1$ to $110_{16}$ corresponds to a first sub-block in the present invention, and each of the comparing circuits $120_1$ to $120_{16}$ corresponds to a unit circuit in the present invention. The nonvolatile memory element 110 can be a fuse element or an antifuse element. The fuse element can be blown by an external force, including a Joule heating breakdown type using a laser beam and a melting breakdown type using a large current. The antifuse element is constituted by a transistor of which an insulating layer is broken down by an application of a high voltage or a diode of which a PN junction is broken down by an application of a high voltage. Furthermore, the nonvolatile memory element 110 can also be one of other ROM elements. All the already-known nonvolatile memory elements and any type of nonvolatile memory element that will be developed can be applied to the nonvolatile memory element pertaining to the present invention. The nonvolatile memory element 110 is a device for storing 1-bit information, and in the first embodiment, two nonvolatile memory elements 110 are allocated to 1 bit of an address. In the first embodiment, sixteen nonvolatile memory elements 110$_1$ to 110$_{16}$ are provided in one circuit block 100, and therefore, it is possible to store an 8-bit address. The address is stored by setting one of the two nonvolatile memory elements 110 that makes a pair to a conductive state and the other to an insulating state. For example, if a bit A1 of an address to be stored is "0", the nonvolatile memory element 110$_1$ is set to the conductive state and the nonvolatile memory element 110$_2$ is set to the insulating state. On the contrary, if the bit A1 of the address to be stored is "1", the nonvolatile memory element 110$_1$ is set to the insulating state and the nonvolatile memory element 110$_2$ is set to the conductive state. One end of the nonvolatile memory element 110 is connected to a predetermined potential (for example, a ground potential GND). An output (the other end) of the nonvolatile memory element 110 that is in the conductive state becomes a Low level, and an output of the nonvolatile memory element 110 that is in the insulating state becomes a High level or a high impedance state. However, in the present invention, it is also possible to adopt a system of using one nonvolatile memory element 110 for 1 bit of an address by using an exclusive OR circuit (XOR circuit). Furthermore, the signal referred in the technical concept of the present invention is not limited to the address signal. The allocation system of the nonvolatile memory elements is not limited to a system of allocating two nonvolatile memory elements 110 to 1 bit of an address.

The portion consisting of the comparing circuits 120$_1$ to 120$_{16}$ corresponds to a second sub-block in the present invention, and each of the comparing circuits 120$_1$ to 120$_{16}$ corresponds to a processing circuit in the present invention. Although it is not particularly limited, as shown in FIG. 3, one comparing circuit 120 is constituted by two N-channel MOS transistors SW1 and SW2 that are connected in series in the first embodiment. One end of the comparing circuit 120 is connected to its corresponding nonvolatile memory element 110, and the other end is connected to a common line LINE. A corresponding bit of an address is supplied to a gate of the transistor SW1. For example, a bit A1 is supplied to a gate of a transistor SW1 belonging to the comparing circuit 120$_1$, and a signal A1B that is an inverted signal of the bit A1 is supplied to a gate of a transistor SW1 belonging to the comparing circuit 120$_2$. On the other hand, an address comparison signal COMP is commonly supplied to gates of transistors SW2. However, it is not essential to constitute the comparing circuit 120 with the two N-channel MOS transistors connected in series. It is also possible to constitute the comparing circuit 120 with a transfer gate. An attention needs to be paid to a fact that the technical concept of the present invention is a configuration that one comparing circuit is connected to one nonvolatile memory element.

The determining circuit 130 corresponds to a third sub-block in the present invention, which is a common circuit that is commonly provided to the comparing circuits 120$_1$ to 120$_{16}$. The determining circuit 130 is connected to the common line LINE. After pre-charging the common line LINE, the determining circuit 130 determines matching of the addresses by detecting whether the common line LINE is discharged by the comparing circuit 120. Therefore, only one determining circuit 130 is provided for one circuit block 100.

More specifically, the determining circuit 130 includes a pre-charge transistor 131 that pre-charges the common line LINE, inverters 132 and 133 that constitute a latch circuit LAT, an inverter 134 that constitutes an output circuit, and transfer gates 135 and 136 that are exclusively turned on. A pre-charge signal PRE is supplied to the pre-charge transistor 131, and complementary latch signals LATT and LATB are supplied to the transfer gates 135 and 136. With this configuration, when the transfer gate 135 is turned on with the pre-charge transistor 131 turned off, a logical level of the common line LINE is loaded to the latch circuit LAT. The loaded data is maintained by turning on the transfer gate 136. An attention needs to be paid to a fact that the technical concept of the present invention is a configuration that one determining circuit is connected with respect to results of a plurality of comparing circuits (the common line LINE).

An operation of the circuit block 100 is explained next.

Before an address comparison is performed, the address comparison signal COMP and the pre-charge signal PRE are at the Low levels. In this condition, because all the transistors SW2 that are N-channel types are turned off and the pre-charge transistor 131 that is a P-channel type is turned on, the common line LINE is pre-charged to the High level. At this moment, the latch signal LATT is at the High level, and the latch signal LATB is at the Low level.

When starting the address comparison, a corresponding bit signal is supplied to the transistor SW1 of the comparing circuit 120, and the logical levels of the address comparison signal COMP and the pre-charge signal PRE are changed to the High levels. This causes one of the transistors SW1 of two comparing circuits 120$_i$ to 120$_{i+1}$ (i is an odd number of 1 to 15) provided corresponding to each bit of the address to be turned on. As a result, the transistors SW1 of a total of eight comparing circuits are turned on. At this moment, if any one of the nonvolatile memory elements 110 connected to the transistors SW1 that are turned on is in the conductive state (the output is the Low level), the common line LINE is discharged through the nonvolatile memory element 110 that is in the conductive state and the logical level of the common line LINE is changed to the Low level. On the other hand, if all the nonvolatile memory elements 110 connected to the transistors SW1 that are turned on are in the insulating state (the output is the High level or the high impedance state), the common line LINE maintained in the pre-charged state.

After the logical level of the common line LINE is determined in this manner, if the logical levels of the latch signal LATT and the latch signal LATB are changed to the Low level and the High level, respectively, the logical level of the common line LINE is loaded to the latch circuit LAT and then output via the inverter 134. The signal loaded to the latch circuit LAT is maintained by setting the logical levels of the latch signal LATT and the latch signal LATB to the High level and the Low level, respectively.

The operation of the circuit block 100 is as described above. A layout of the circuit block according to the first embodiment is explained next in detail.

Figure 24:
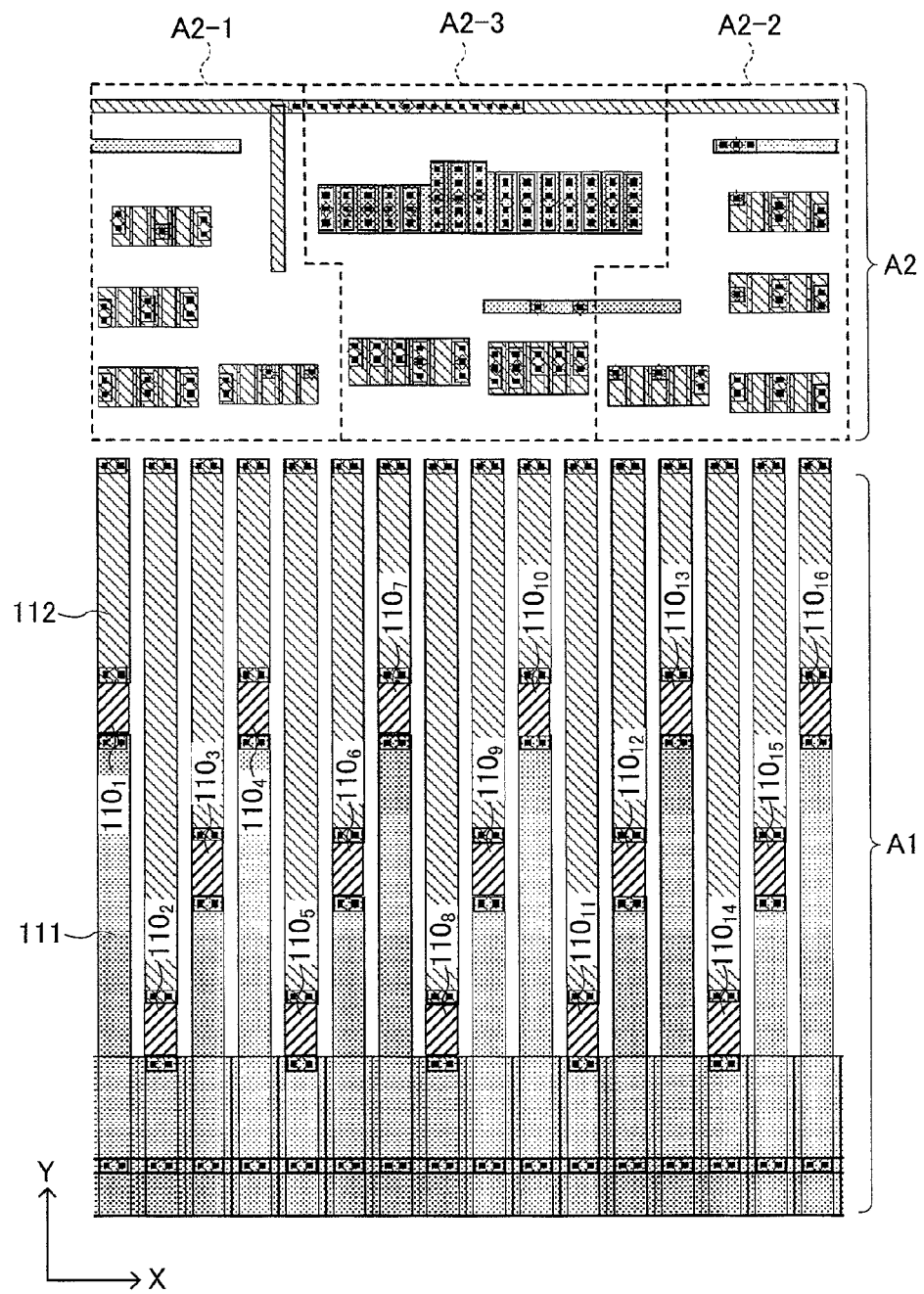
FIG. 24 is a layout diagram showing an example that a group of three fuses is formed by mutually shifting Y coordinates of the fuses.

As shown in FIGS. 1 and 2, the nonvolatile memory element 110 is arranged in an area A1 in the first embodiment. The area A1 has a rectangular geometry with an X direction as a long side. The nonvolatile memory elements 110$_1$ to 110$_{16}$ are arranged in this order in the X direction in the area A1. Furthermore, in the first embodiment, the comparing circuit 120 and the determining circuit 130 are arranged in an area A2. The area A2 also has a rectangular geometry with the X direction as a long side, being adjacent to the area A1 in a Y direction. Lengths of the area A1 and the area A2 in the X direction are substantially equal to each other, so that the entire shape including the area A1 and the area A2 is a rectangular shape. Particularly with laser fuses, the arrangement of a plurality of nonvolatile memory elements 110 in order in the X direction is important in the "on the fly" technology in which a corresponding fuse is blown while moving a laser spot in the X direction with the Y axis fixed for saving the process time and enhancing the process precision. As shown in FIG. 24, a group of three fuses can be formed by mutually shifting Y coordinates of the fuses and a plurality of groups of three fuses can be arranged in the X direction, to reduce the area of the area A1 in the X direction by reducing an arrangement pitch between the nonvolatile memory elements 110 in the X direction. Even when the Y coordinates of the nonvolatile memory elements 110 are shifted in the Y direction in the above manner, it suffices that if the entire shape including each of the nonvolatile memory elements 110 and line sections 111 and 112 connected thereto is the same among the groups and the groups having the same shape are arranged in the X direction. That is, the concept of the unit circuit referred in the present invention includes the line sections 111 and 112, which means that the constituent elements (the nonvolatile memory elements 110 according to the first embodiment) themselves are not necessarily to be arranged in a straight line in the X direction.

The area A2 includes three sub-areas A2-1 to A2-3 arranged in the X direction. The eight comparing circuits $120_1$ to $120_8$ corresponding to the nonvolatile memory elements $110_1$ to $110_8$, among the sixteen comparing circuits $120_1$ to $120_{16}$, are arranged in the sub-area A2-1, and the eight comparing circuits $120_9$ to $120_{16}$ corresponding to the nonvolatile memory elements $110_9$ to $110_{16}$, among the sixteen comparing circuits $120_1$ to $120_{16}$, are arranged in the sub-area A2-2. The sub-area A2-3 is sandwiched between the sub-area A2-1 and the sub-area A2-2, in which the determining circuit 130 is arranged.

As shown in FIG. 2, among the eight comparing circuits $120_1$ to $120_8$, the comparing circuits $120_1$, $120_4$, $120_5$, and $120_8$ are arranged in the X direction in a portion near the area A1. The comparing circuits $120_2$ and $120_3$ are arranged in the Y direction as viewed from the comparing circuits $120_1$ and $120_4$, and the comparing circuits $120_6$ and $120_7$ are arranged in the Y direction as viewed the comparing circuits $120_2$ and $120_3$. The layout in the sub-area A2-2 is similar to the layout in the sub-area A2-1. In this manner, in the first embodiment, all the comparing circuits $120_1$ to $120_{16}$ are not sequentially arranged in the X direction their corresponding nonvolatile memory elements $110_1$ to $110_{16}$ that are sequentially arranged in the X direction, but some of the comparing circuits 120 are arranged in the Y direction, to reduce a width of the sub-areas A2-1 and A2-2 in the X direction. With this arrangement, the sub-area A2-3 can be placed between the sub-area A2-1 and the sub-area A2-2, which makes it possible to set the entire shape of the circuit block 100 to a rectangular shape by arranging the determining circuit 130 in the sub-area A2-3.

Two comparing circuits adjacent to each other in the X direction, such as the comparing circuits $120_1$ and $120_4$, share a drain (a contact of a diffusion area and a signal line) with each other. Specifically, as shown in FIG. 1, five n-type diffusion areas 121 to 125 are arranged on a p-type substrate in the X direction in a portion in which the comparing circuits $120_1$ and $120_4$ are formed, thereby four N-channel MOS transistors are formed. Among the four N-channel MOS transistors, two transistors on one side are the transistors SW1 and SW2 that constitute the comparing circuit $120_1$, and two transistors on the other side are the transistors SW1 and SW2 that constitute the comparing circuit $120_4$. As shown in FIG. 25 that shows upper layer lines of the circuit shown in FIG. 1, among the five n-type diffusion areas 121 to 125, the diffusion areas 121 and 125 on both sides are connected to their corresponding nonvolatile memory elements $110_1$ and $110_4$, respectively, and the diffusion area 123 located at the center is connected to the common line LINE.

In addition, line areas LA1 and LA2 in which no transistors are formed are provided in the sub-areas A2-1 and A2-2. As shown in FIG. 25, in the line areas LA1 and LA2, lines for respectively connecting a plurality of nonvolatile memory elements 110 and a plurality of comparing circuits 120 are arranged.

With the above layout, the entire shape of the circuit block 100 becomes a rectangular shape. Therefore, the layout causes no waste of space even when a plurality of circuit blocks 100 are repeatedly arranged, which makes it possible to reduce the chip area. In addition, because the comparing circuits 120 are divided into the two sub-areas A2-1 and A2-2 in the first embodiment, it is also possible to suppress lengths of the lines that connect the nonvolatile memory elements 110 and the comparing circuits 120 corresponding to each other.

Figure 4:
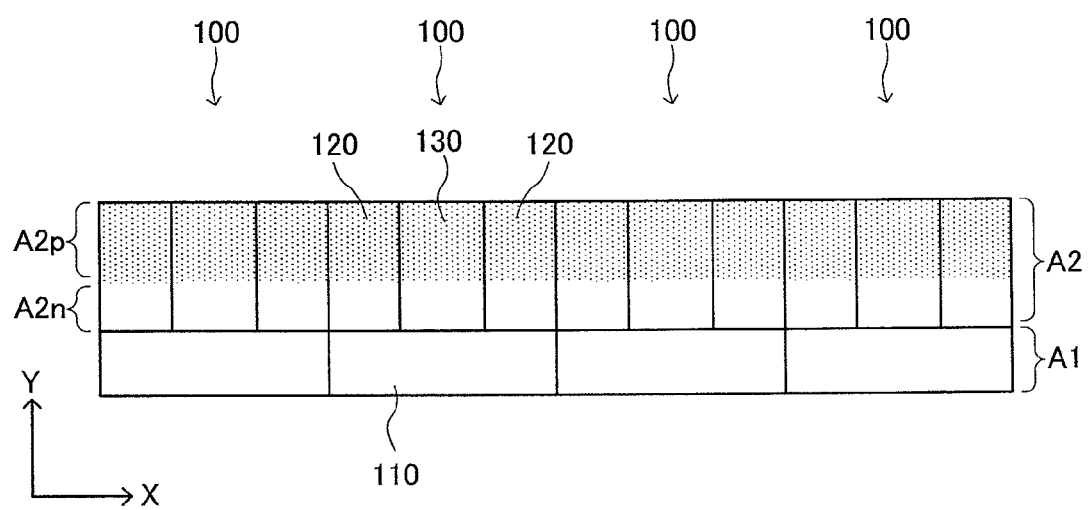
FIG. 4 is a schematic layout diagram showing a plurality of circuit blocks 100, repeatedly arranged in the X direction.

FIG. 4 is a schematic layout diagram showing a plurality of circuit blocks 100, repeatedly arranged in the X direction.

As shown in FIG. 4, by arranging a plurality of circuit blocks 100 repeatedly in the X direction, a plurality of areas A1 can be laid out in the X direction in a continuous manner. Therefore, it is possible to arrange a large number of the nonvolatile memory elements 110, such as fuse elements, along the X direction. In addition, if the comparing circuit 120 is constituted by a transfer gate that is formed with complementary type transistors (for example, a P-channel transistor and an N-channel transistor), it is preferable to form a layout such that a P-channel area in the comparing circuit 120 and a P-channel area in the determining circuit 130 are continuously arranged in the X direction. In other words, it is preferable to form a layout such that P-channel MOS transistors included in the comparing circuit 120 and the determining circuit 130 be arranged to face each other across a boundary between the comparing circuit 120 and the determining circuit 130, and similarly, N-channel MOS transistors included in the comparing circuit 120 and the determining circuit 130 be arranged to face each other across the boundary. A shaded area shown in FIG. 4 is the P-channel area, and by forming such a layout, it is possible to form the P-channel MOS transistors in the comparing circuit 120 and the P-channel MOS transistors in the determining circuit 130 in the same n-well, making it possible to realize a further reduction of the chip area. An order of arranging the P-channel transistor area and the N-channel transistor area is no object. For example, if the nonvolatile memory element 110 is an element of a structure pertaining to a P-channel (a capacitive element type antifuse element formed with a P-channel transistor), it is preferable to arrange the P-channel transistors on a side of the boundary of the area A2 adjacent to the area A1. Furthermore, the arrangement of the P-channel area and the N-channel area can be flexibly changed according to a well structure such as a transistor structure adopted in the semiconductor device.

If the nonvolatile memory element 110 is constituted by an antifuse element employing an N-channel MOS transistor, as shown in FIG. 4, it is preferable to divide the area A2 into an area A2n that is close to the area A1 and an area A2p that is far from the area A1 and take the area A2n as the N-channel area and the area A2p as the P-channel area. In other words, it is preferable to arrange the N-channel MOS transistor included in the nonvolatile memory element 110 and the N-channel MOS transistors included in the comparing circuit 120 and the determining circuit 130 in a manner such that they face each other across their respective boundaries. With this arrangement, because the N-channel MOS transistor in the comparing circuit 120 and the N-channel MOS transistor constituting the antifuse can be formed in the same p-well, it is possible to realize a further reduction of the chip area.

Figure 5:
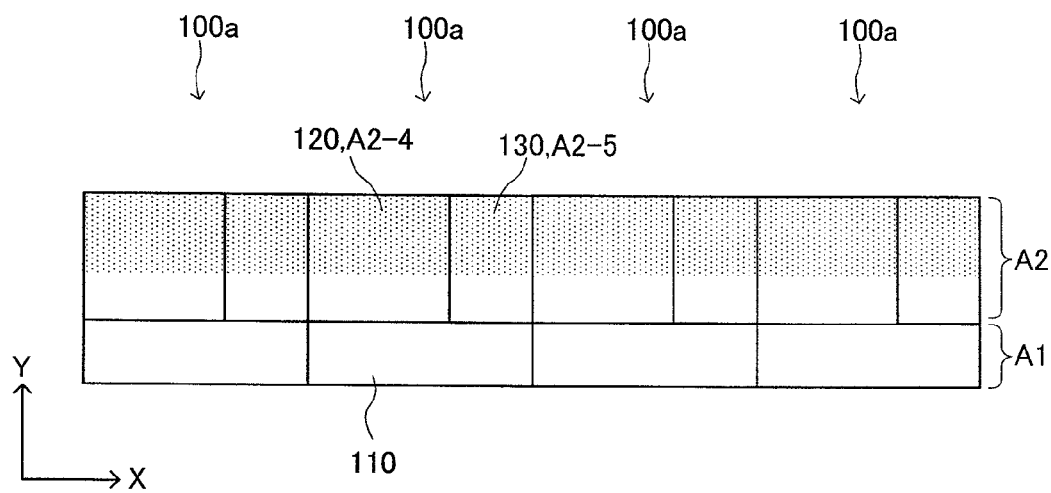
FIG. 5 is a schematic layout diagram showing a plurality of circuit blocks 100a according to a first modification of the first embodiment, repeatedly arranged in the X direction.

FIG. 5 is a schematic layout diagram showing a plurality of circuit blocks 100a according to a first modification of the first embodiment, repeatedly arranged in the X direction.

The circuit block 100a shown in FIG. 5 is different from the circuit block 100 in the layout of the area A2. Specifically, in the circuit block 100a shown in FIG. 5, the area A2 includes two sub-areas A2-4 and A2-5 arranged in the X direction. The comparing circuits 120 are arranged together in the sub-area A2-4, and the determining circuit 130 is arranged in the sub-area A2-5. Under a condition such as when the number of the nonvolatile memory elements 110 is small and the length of the circuit block in the X direction is short, when the arrangement pitch of the nonvolatile memory elements 110 in the X direction is relatively larger than a size a transistor, or when a resistance value of a line that connects the nonvolatile memory element 110 and the comparing circuit 120 (a predetermined resistance value per unit length of the line resistance) is low, arranging a plurality of comparing circuits 120 together in the sub-area A2-4 makes it possible to efficiently arrange a plurality of transistors in a collective manner.

In this example, if the comparing circuit 120 is constituted by a transfer gate, it is preferable to arrange the P-channel area in a shaded portion in FIG. 5. This arrangement is particularly desirable when the nonvolatile memory element 110 is constituted by an antifuse element employing an N-channel MOS transistor. The reason is as already explained above.

Figure 6:
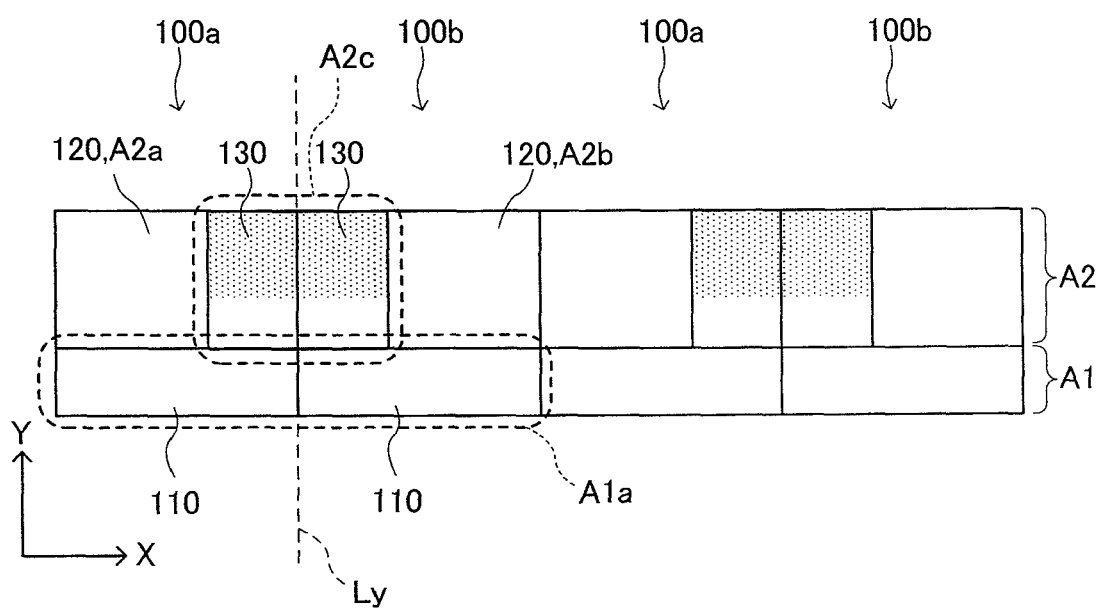
FIG. 6 is a schematic layout diagram showing a plurality of circuit blocks 100a according to the first modification of the first embodiment and a plurality of circuit blocks 100b according to a second modification of the first embodiment, repeatedly arranged in the X direction in an alternate manner.

FIG. 6 is a schematic layout diagram showing a plurality of circuit blocks 100a according to the first modification of the first embodiment and a plurality of circuit blocks 100b according to a second modification of the first embodiment, repeatedly arranged in the X direction in an alternate manner.

As shown in FIG. 6, the circuit blocks 100a and 100b are symmetrical with respect to a straight line Ly that extends along the Y direction. In other words, two circuit blocks 100a and 100b adjacent to each other in the X direction make a mirror arrangement with respect to a boundary line between them. By having such a layout, if the comparing circuit 120 is only constituted by an N-channel MOS transistor, that is, even when the determining circuit 130 only requires the n-well, as shown in a shaded portion, it is possible to form the P-channel MOS transistors of two adjacent determining circuits 130 in the same n-well.

To explain the layout shown in FIG. 6 from another viewpoint, when an area in which the nonvolatile memory elements 110 of two circuit blocks 100a and 100b are arranged is defined as an area A1a, an area in which the comparing circuits 120 of the circuit block 100a are arranged is defined as an area A2a, an area in which the comparing circuits 120 of the circuit block 100b are arranged is defined as an area A2b, and the determining circuits 130 of the circuit blocks 100a and 100b are arranged is defined as an area A2c, the area A2c is sandwiched between the area A2a and the area A2b. A shape of a combined area that is constituted by the areas A2a, A2b, and A2c is a rectangular shape, with a length in the X direction substantially equal to a length of the area A1a in the X direction.

Figure 7:
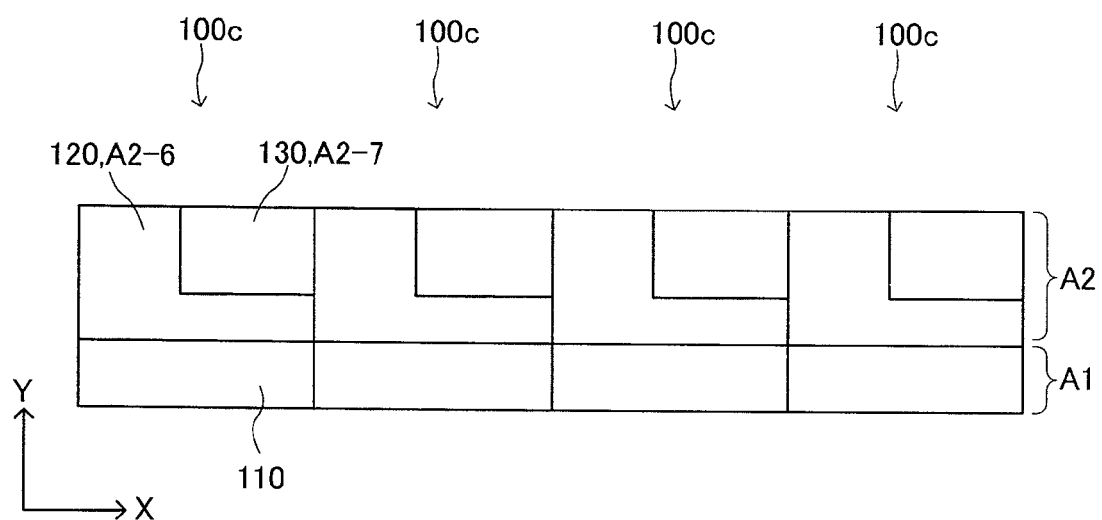
FIG. 7 is a schematic layout diagram showing a plurality of circuit blocks 100c according to a third modification of the first embodiment, repeatedly arranged in the X direction.

FIG. 7 is a schematic layout diagram showing a plurality of circuit blocks 100c according to a third modification of the first embodiment, repeatedly arranged in the X direction.

The circuit block 100c shown in FIG. 7 is different from the circuit block 100 in the layout of the area A2. Specifically, the circuit block 100c shown in FIG. 7 includes two sub-areas A2-6 and A2-7. The comparing circuits 120 are arranged together in the sub-area A2-6, and the determining circuit 130 is arranged in the sub-area A2-7. A boundary between the sub-area A2-6 and the sub-area A2-7 includes a boundary along the X direction and a boundary along the Y direction, thereby the sub-area A2-7 is surrounded by the sub-area A2-6 from two sides. This layout is preferable when a size of the comparing circuit 120 is relatively large (specifically, when the number of the nonvolatile memory elements 110 is large and a ratio of an area of the comparing circuits 120 corresponding to the nonvolatile memory elements 110 to an area of the determining circuit 130 that is commonly supplied to the nonvolatile memory elements 110 is relatively large). In addition, because the nonvolatile memory element 110 and the comparing circuit 120 are adjacent to each other along the entire length in the X direction, when a specific resistance of a line that connects the nonvolatile memory element 110 and the comparing circuit 120 is high, it is also possible to reduce the length of the line.

Figure 8:
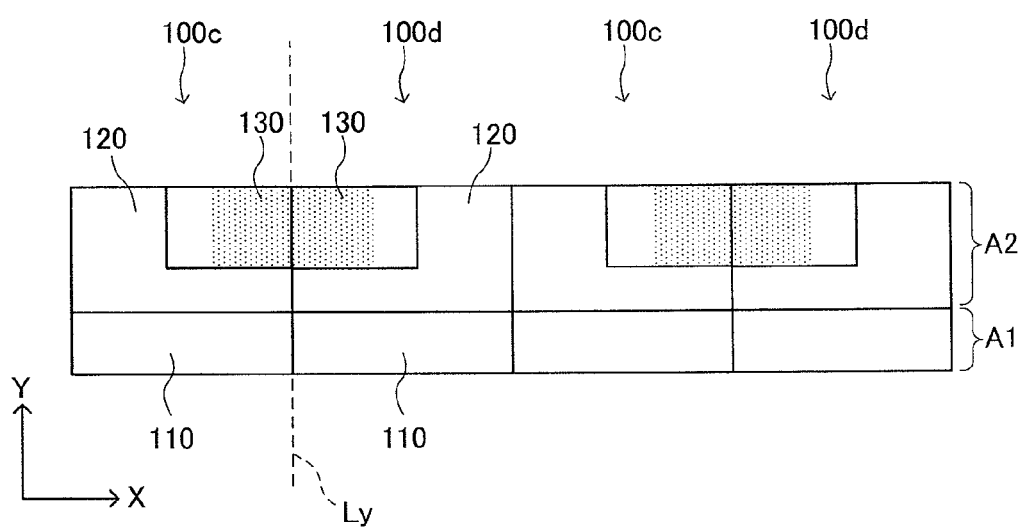
FIG. 8 is a schematic layout diagram showing a plurality of circuit blocks 100c according to the third modification of the first embodiment and a plurality of circuit blocks 100d according to a fourth modification of the first embodiment, repeatedly arranged in the X direction in an alternate manner.

FIG. 8 is a schematic layout diagram showing a plurality of circuit blocks 100c according to the third modification of the first embodiment and a plurality of circuit blocks 100d according to a fourth modification of the first embodiment, repeatedly arranged in the X direction in an alternate manner.

As shown in FIG. 8, the circuit blocks 100c and 100d are symmetrical with respect to the straight line Ly that extends along the Y direction. In other words, two circuit blocks 100c and 100d adjacent to each other in the X direction make a mirror arrangement with respect to a boundary line between them. By having such a layout, as in the layout shown in FIG. 6, even when the determining circuit 130 only requires the n-well, as shown in a shaded portion, it is possible to form the P-channel MOS transistors of two adjacent determining circuits 130 in the same n-well.

Figure 9:
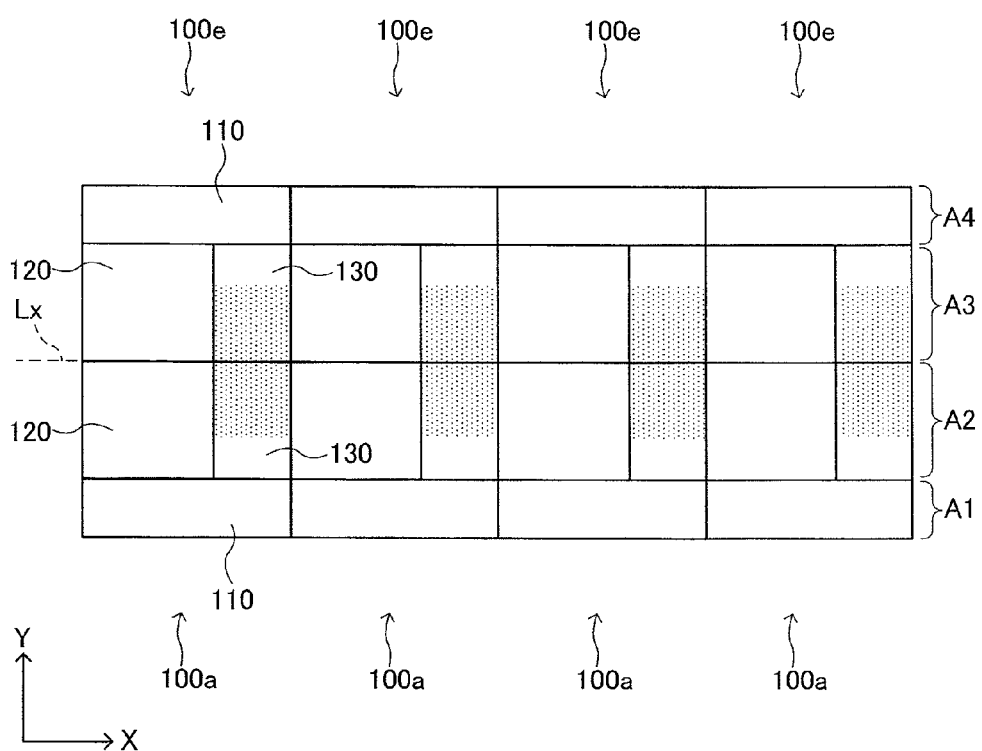
FIG. 9 is a schematic layout diagram showing a plurality of circuit blocks 100a according to the first modification of the first embodiment repeatedly arranged in the X direction and a plurality of circuit blocks 100e according to a fifth modification of the first embodiment repeatedly arranged in the X direction.

FIG. 9 is a schematic layout diagram showing a plurality of circuit blocks 100a according to the first modification of the first embodiment repeatedly arranged in the X direction and a plurality of circuit blocks 100e according to a fifth modification of the first embodiment repeatedly arranged in the X direction.

As shown in FIG. 9, the circuit blocks 100a and 100e are symmetrical with respect to a straight line Lx that extends along the X direction. In other words, two circuit blocks 100a and 100e adjacent to each other in the Y direction make a mirror arrangement with respect to a boundary line between them. That is, the two circuit blocks 100a and 100e adjacent to each other in the Y direction constitute a unit, which is repeatedly arranged in the X direction.

More specifically, the comparing circuits 120 and the determining circuit 130 included in the circuit block 100e are arranged in an area A3 that is provided in a manner such that the area A2 is sandwiched between the area A1 and the area A3, and the nonvolatile memory elements 110 included in the circuit block 100e are arranged in an area A4 that is provided in a manner such that the area A3 is sandwiched between the area A2 and the area A4. The comparing circuits 120 arranged in the areas A2 and A3 are located facing each other in the Y direction, and the determining circuits 130 arranged in the areas A2 and A3 are located facing each other in the Y direction.

With this layout, because a plurality of circuit blocks are arranged being adjacent to each other in the Y direction, it is possible to arrange more circuit blocks. In addition, even when the determining circuit 130 only requires the n-well, as shown in a shaded portion, it is possible to form the P-channel MOS transistors of two determining circuits 130 that are adjacent to each other in the Y direction in the same n-well.

Figure 10:
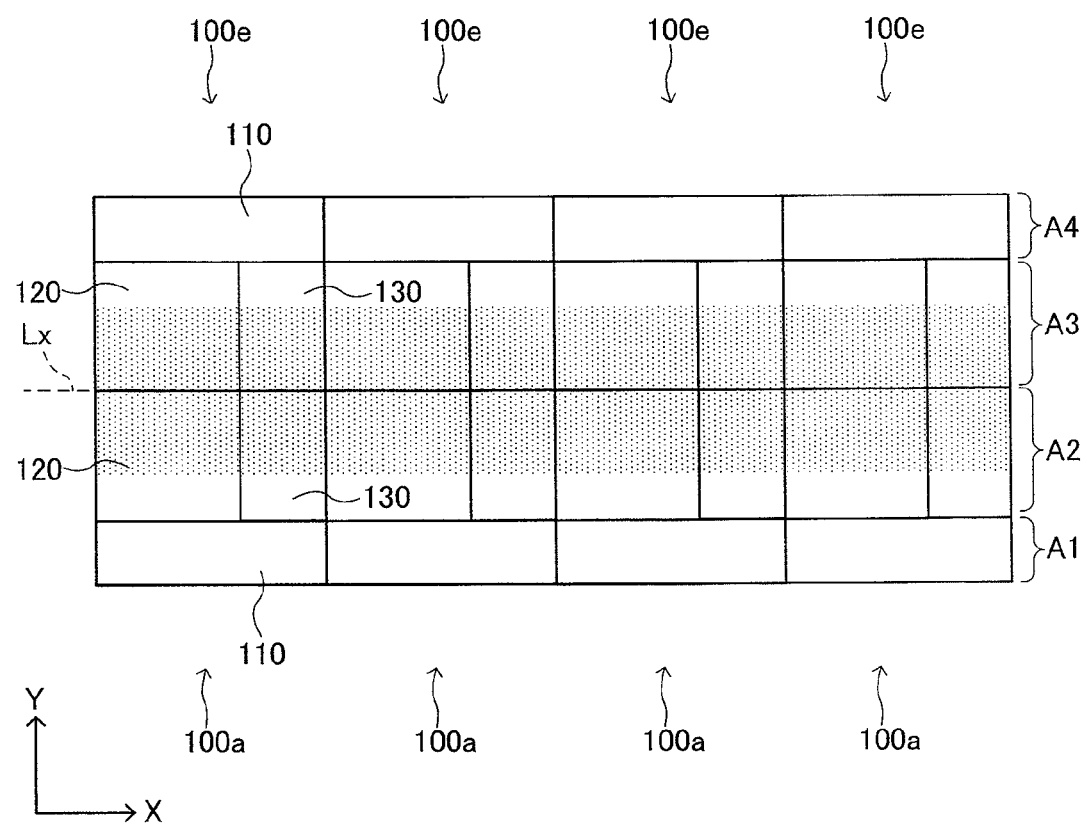
FIG. 10 is a diagram for explaining arrangement of the P-channel area when the comparing circuit 120 is constituted by a transfer gate.

On the other hand, if the comparing circuit 120 is constituted by a transfer gate, it is preferable to arrange the P-channel area in a shaded portion in FIG. 10. With this arrangement, the P-channel MOS transistors used in a large number of circuit blocks can be formed in one large n-well, which makes it possible to reduce the chip area. This arrangement is particularly desirable when the nonvolatile memory element 110 is constituted by an antifuse element employing an N-channel MOS transistor. The reason is as already explained above.

Figure 11:
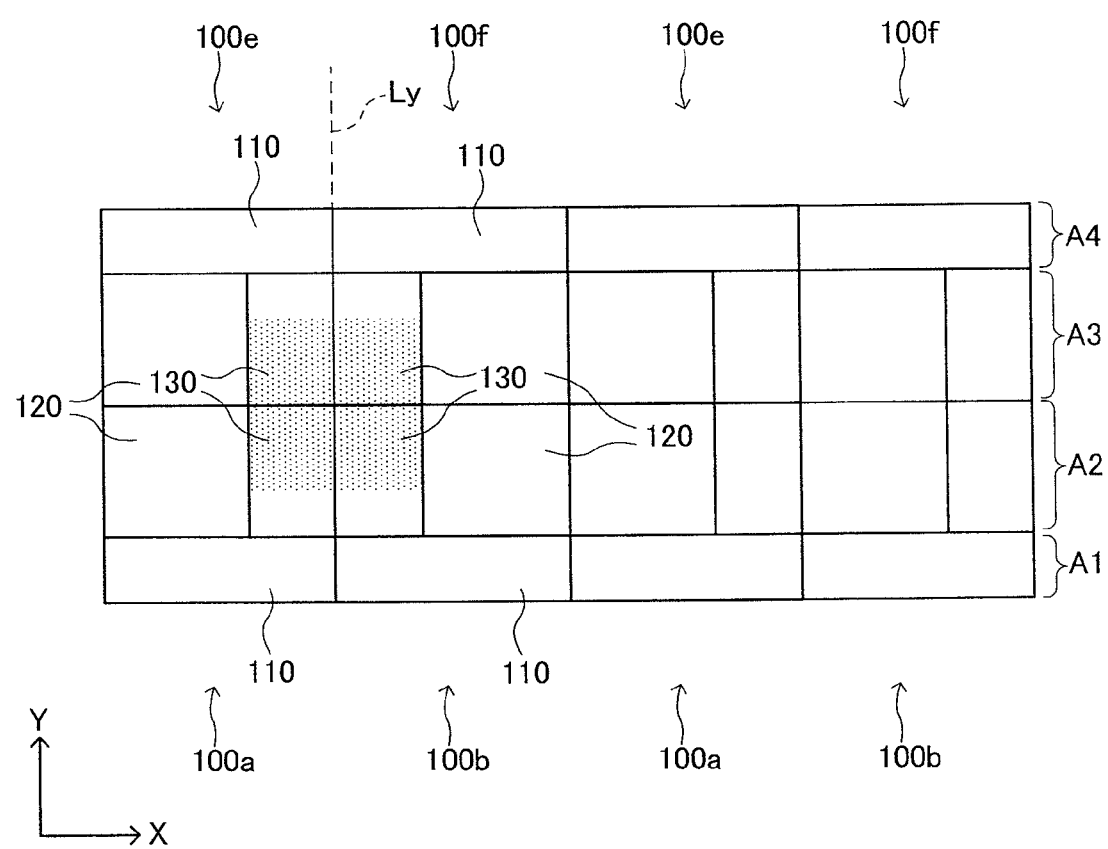
FIG. 11 is a schematic layout diagram showing a plurality of circuit blocks 100a according to the first modification of the first embodiment and a plurality of circuit blocks 100b according to the second modification of the first embodiment repeatedly arranged in the X direction in an alternate manner and a plurality of circuit blocks 100e according to the fifth modification of the first embodiment and a plurality of circuit blocks 100f according to a sixth modification of the first embodiment repeatedly arranged in the X direction in an alternate manner.

FIG. 11 is a schematic layout diagram showing a plurality of circuit blocks 100a according to the first modification of the first embodiment and a plurality of circuit blocks 100b according to the second modification of the first embodiment repeatedly arranged in the X direction in an alternate manner and a plurality of circuit blocks 100e according to the fifth modification of the first embodiment and a plurality of circuit blocks 100f according to a sixth modification of the first embodiment repeatedly arranged in the X direction in an alternate manner.

As shown in FIG. 11, the circuit blocks 100e and 100f are symmetrical with respect to the straight line Ly that extends along the Y direction. In other words, two circuit blocks 100e and 100f adjacent to each other in the X direction make a mirror arrangement with respect to a boundary line between them. That is, the four circuit blocks 100a, 100b, 100e, and 100f adjacent to each other in the X direction and the Y direction constitute a unit, which is repeatedly arranged in the X direction.

With this layout, even when the determining circuit 130 only requires the n-well, as shown in a shaded portion, it is possible to form the P-channel MOS transistors of four determining circuits 130 that are adjacent to each other in the X direction and the Y direction in the same n-well.

Figure 12:
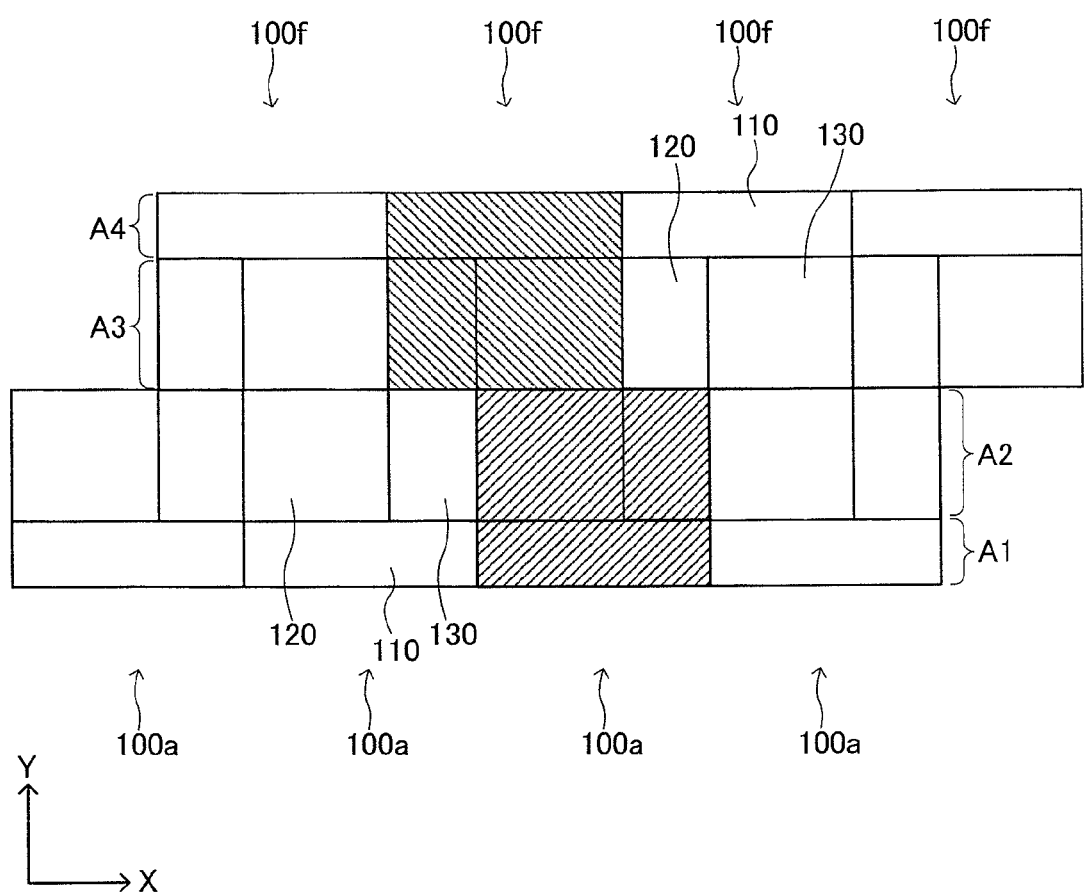
FIG. 12 is a schematic layout diagram showing a plurality of circuit blocks 100a according to the first modification of the first embodiment repeatedly arranged in the X direction and a plurality of circuit blocks 100f according to the sixth modification of the first embodiment repeatedly arranged in the X direction.

FIG. 12 is a schematic layout diagram showing a plurality of circuit blocks 100a according to the first modification of the first embodiment repeatedly arranged in the X direction and a plurality of circuit blocks 100f according to the sixth modification of the first embodiment repeatedly arranged in the X direction. In FIG. 12, for the sake of its viewability, a diagonally right up hatching is applied on one of the circuit blocks 100a, and a diagonally right down hatching is applied on one of the circuit blocks 100f.

As shown in FIG. 12, the coordinates of the circuit blocks 100a and 100f in the X direction do not match each other, but they are shifted from each other in the X direction by a length of the comparing circuit 120 or the determining circuit 130 in the X direction. With this layout, same effects as those explained with reference to FIGS. 9 and 10 can be achieved. In this manner, in the present invention, a match of the coordinates of the circuit blocks in the X direction is not essential when arranging a plurality of circuit blocks next to each other in the Y direction.

As explained above, according to the first embodiment, because the shape of the circuit block that compares and determines one address is a rectangular shape, even when a plurality of circuit blocks are arranged in a repeated manner, the layout area never fails to form a shaped block. As a result, it is possible to obtain a layout with no waste of space.

A second embodiment of the present invention is explained below.

Figure 13:
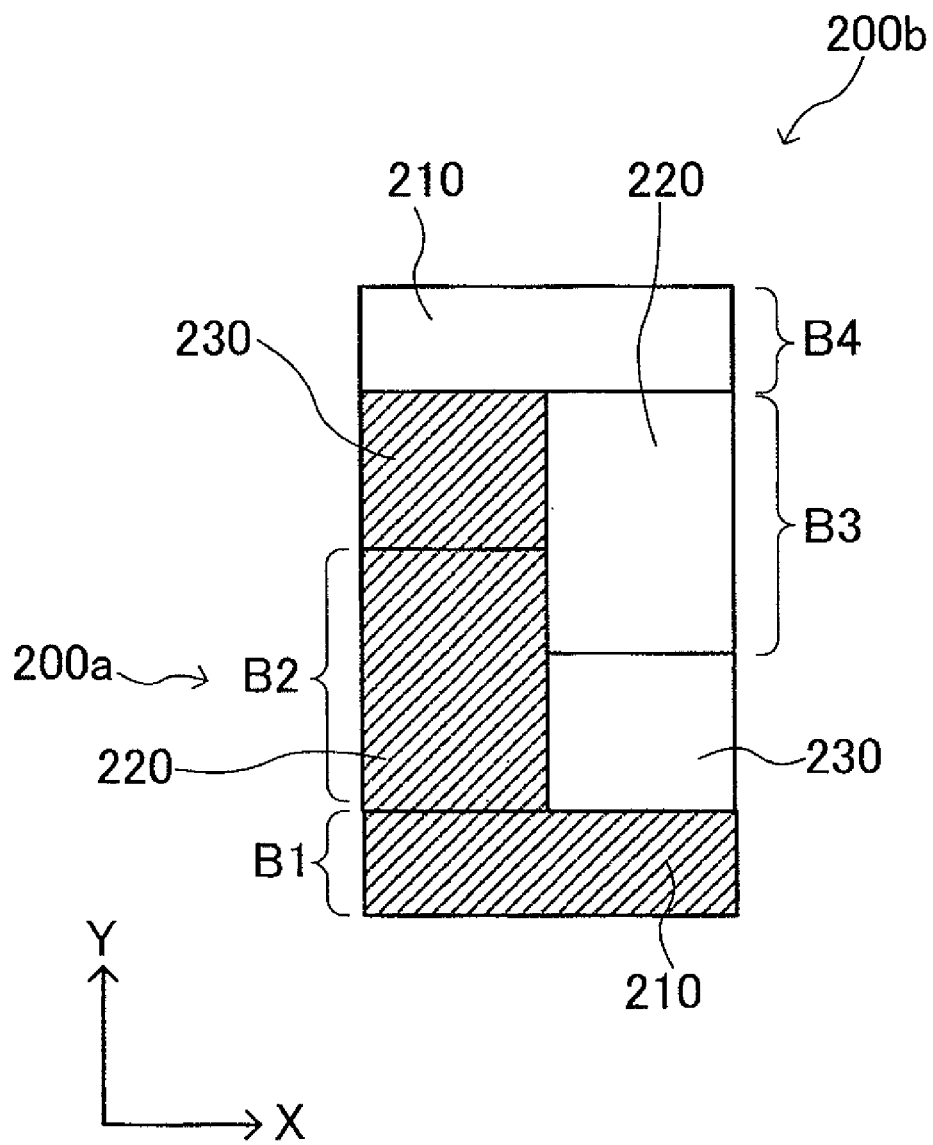
FIG. 13 is a schematic layout diagram of circuit blocks 200a and 200b included in a semiconductor device according to the second embodiment.

FIG. 13 is a schematic layout diagram of circuit blocks 200a and 200b included in a semiconductor device according to the second embodiment. In FIG. 13, a portion on which a hatching is applied is the circuit block 200a, and a portion on which no hatching is applied is the circuit block 200b.

As shown in FIG. 13, each of the circuit blocks 200a and 200b is constituted by a nonvolatile memory element 210, comparing circuit 220, and a determining circuit 230. The circuit configurations of the nonvolatile memory element 210, the comparing circuit 220, and the determining circuit 230 are the same as those of the nonvolatile memory element 110, the comparing circuit 120, and the determining circuit 130 explained in the first embodiment. Therefore, redundant explanations of the circuit configuration will be omitted, and explanations are given below focusing on the layout.

As shown in FIG. 13, in the second embodiment, the nonvolatile memory element 210 of the circuit block 200a is arranged in an area B1. The area B1 has a rectangular shape with the X direction as a long side, and a plurality of nonvolatile memory elements 210 are arranged in the area B1 in the X direction. The comparing circuit 220 and the determining circuit 230 of the circuit block 200a are arranged side by side in the Y direction. A portion constituted by the comparing circuit 220 and the determining circuit 230 forms a rectangular shape of which a length in the X direction is a half of a length of the area B1 in the X direction. With this configuration, the entire shape of the circuit block 200a forms an L-shape.

The circuit block 200b has a layout obtained by rotating the circuit block 200a by 180°. Other than this, a configuration of the circuit block 200b is the same as that of the circuit block 200a. Therefore, as shown in FIG. 13, the entire shape of a combination of the two circuit blocks 200a and 200b forms a rectangular shape.

To explain a layout of a portion that is constituted by a pair of the circuit blocks 200a and 200b in more detail, the comparing circuit 220 included in the circuit block 200a and the determining circuit 230 included in the circuit block 200b are arranged in an area B2. The area B2 is adjacent in the Y direction to the area B1 in which the nonvolatile memory element 210 is arranged. The determining circuit 230 included in the circuit block 200a and the comparing circuit 220 included in the circuit block 200b are arranged in an area B3 that is provided in a manner such that the area B2 is sandwiched between the area B1 and the area B3. The nonvolatile memory element 210 included in the circuit block 200b is arranged in an area B4 that is provided in a manner such that the area B3 is sandwiched between the area B2 and the area B4. In this manner, in the second embodiment, the areas B1, B2, B3, and B4 are arranged in the Y direction with the same length in the X direction.

In this manner, in the second embodiment, because the shape of the combination of the two circuit blocks 200a and 200b is a rectangular shape, even when the circuit blocks 200a and 200b are repeatedly arranged, it causes no waste of space in the layout. Therefore, it is possible to reduce the chip area. The layout according to the second embodiment is preferable when an occupied area of the comparing circuit 220 and the determining circuit 230 is relatively smaller than that in the first embodiment.

Figure 14:
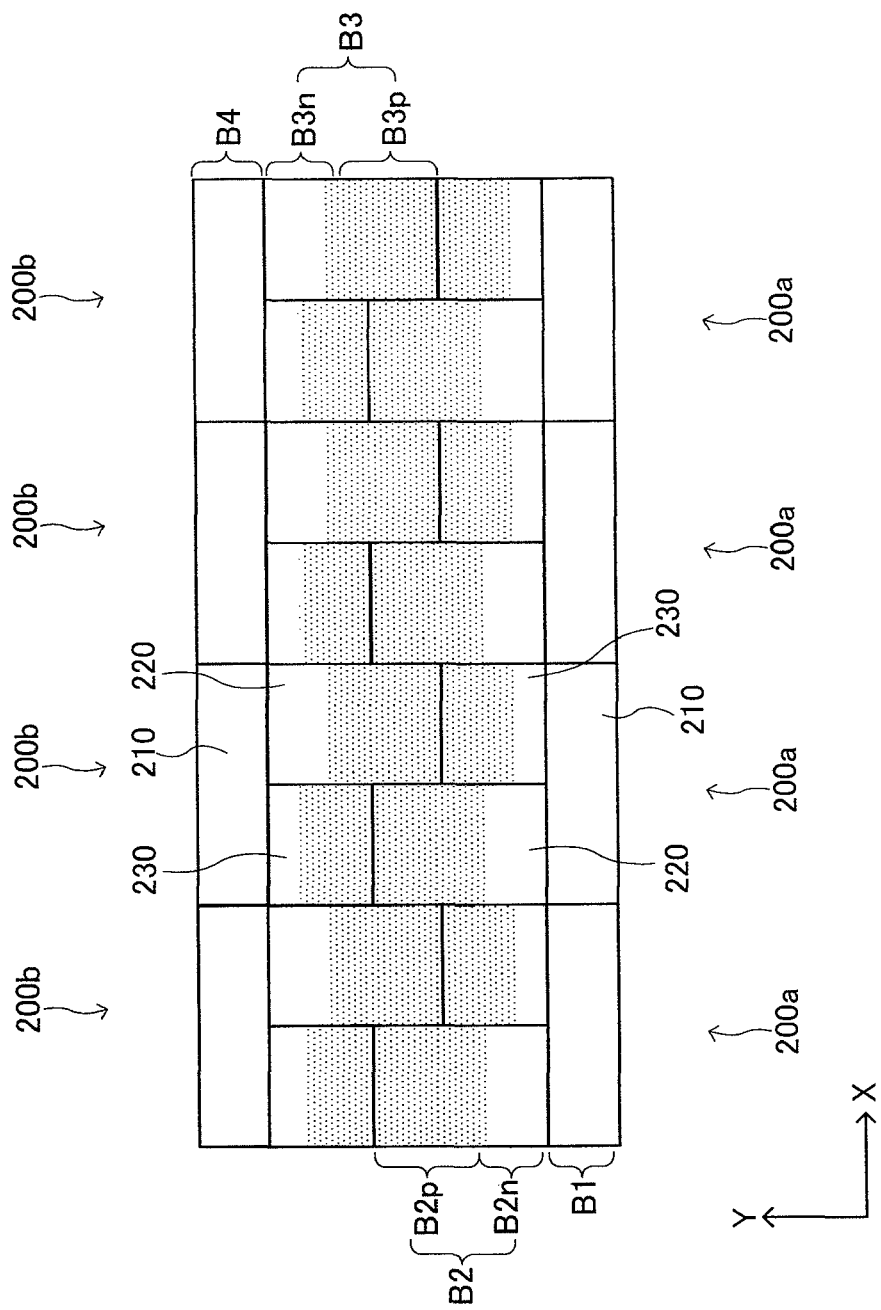
FIG. 14 is a schematic layout diagram showing the combination of the circuit blocks 200a and 200b repeatedly arranged in the X direction.

FIG. 14 is a schematic layout diagram showing the combination of the circuit blocks 200a and 200b repeatedly arranged in the X direction.

As shown in FIG. 14, by arranging the combination of the circuit blocks 200a and 200b repeatedly in the X direction, a plurality of areas B1 and B4 can be laid out in the X direction in a continuous manner. Therefore, it is possible to arrange a large number of the nonvolatile memory elements 210, such as fuse elements, along the X direction. In addition, if the comparing circuit 220 is constituted by a transfer gate, as shown in a shaded portion, it is possible to realize a further reduction of the chip area by taking a layout in a manner such that the P-channel area in the comparing circuit 220 and the P-channel area in the determining circuit 230 are arranged in a continuous manner in the X direction.

In addition, if the nonvolatile memory element 210 is constituted by an antifuse element employing an N-channel MOS transistor, as shown in FIG. 14, it is preferable to divide the areas B2 and B3 in the Y direction and take areas B2n and B3n that are close to the areas B1 and B4, respectively, as the N-channel areas and areas B2p and B3p that are far from the areas B1 and B4, respectively, as the P-channel areas. With this arrangement, because the N-channel MOS transistor in the comparing circuit 220 and the N-channel MOS transistor constituting the antifuse can be formed in the same p-well, it is possible to realize a further reduction of the chip area.

Figure 15:
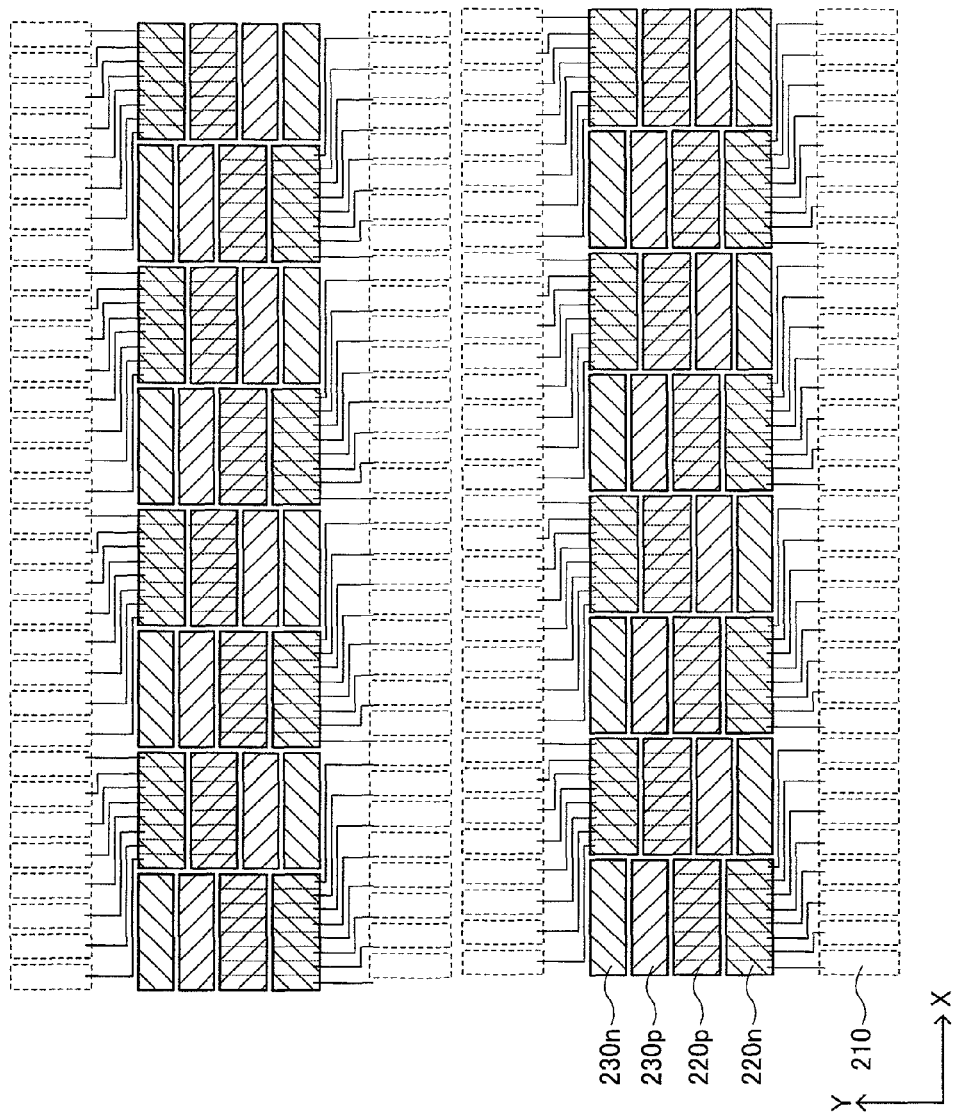
FIG. 15 is a schematic layout diagram showing the combination of the circuit blocks 200a and 200b repeatedly arranged in the X direction and the Y direction.

FIG. 15 is a schematic layout diagram showing the combination of the circuit blocks 200a and 200b repeatedly arranged in the X direction and the Y direction. In FIG. 15, for the sake of its viewability, an example is shown in which the nonvolatile memory element 210 included in each of the circuit blocks 200a and 200b is 8 bits. As shown in FIG. 15, because the shape of the combination of the circuit blocks 200a and 200b is a rectangular shape, even when a plurality of circuit blocks are arranged in a repeated manner in the X direction and the Y direction, the entire shape forms a shaped block. As a result, it is possible to realize a further reduction of the chip area.

Figure 16:
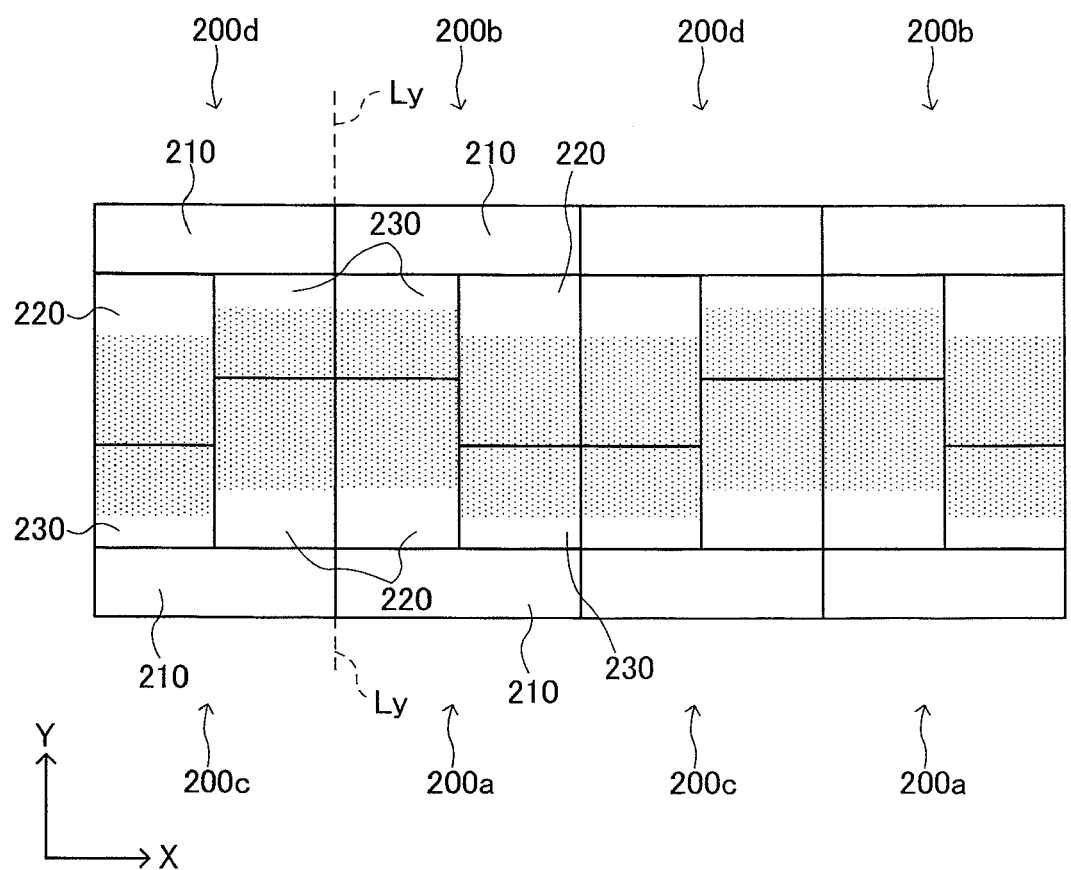
FIG. 16 is a schematic layout diagram showing a plurality of units of the combination of the circuit blocks 200a and 200b according to the second embodiment and a combination of circuit blocks 200c and 200d according to a first modification of the second embodiment, repeatedly arranged in the X direction.

FIG. 16 is a schematic layout diagram showing a plurality of units of the combination of the circuit blocks 200a and 200b according to the second embodiment and a combination of circuit blocks 200c and 200d according to a first modification of the second embodiment, repeatedly arranged in the X direction.

As shown in FIG. 16, the circuit blocks 200a and 200c are symmetrical with respect to the straight line Ly that extends along the Y direction, and similarly, the circuit blocks 200b and 200d are symmetrical with respect to the straight line Ly. In other words, two circuit blocks 200a and 200c adjacent to each other in the X direction make a mirror arrangement with respect to a boundary line between them, and similarly, two circuit blocks 200b and 200d make a mirror arrangement with respect to a boundary line between them. With this layout, as shown in a shaded portion in FIG. 16, a shape of the P-channel area becomes a shape having more straight-line potions than in the example shown in FIG. 15. Therefore, it is possible to realize a further reduction of the chip area.

Figure 17:
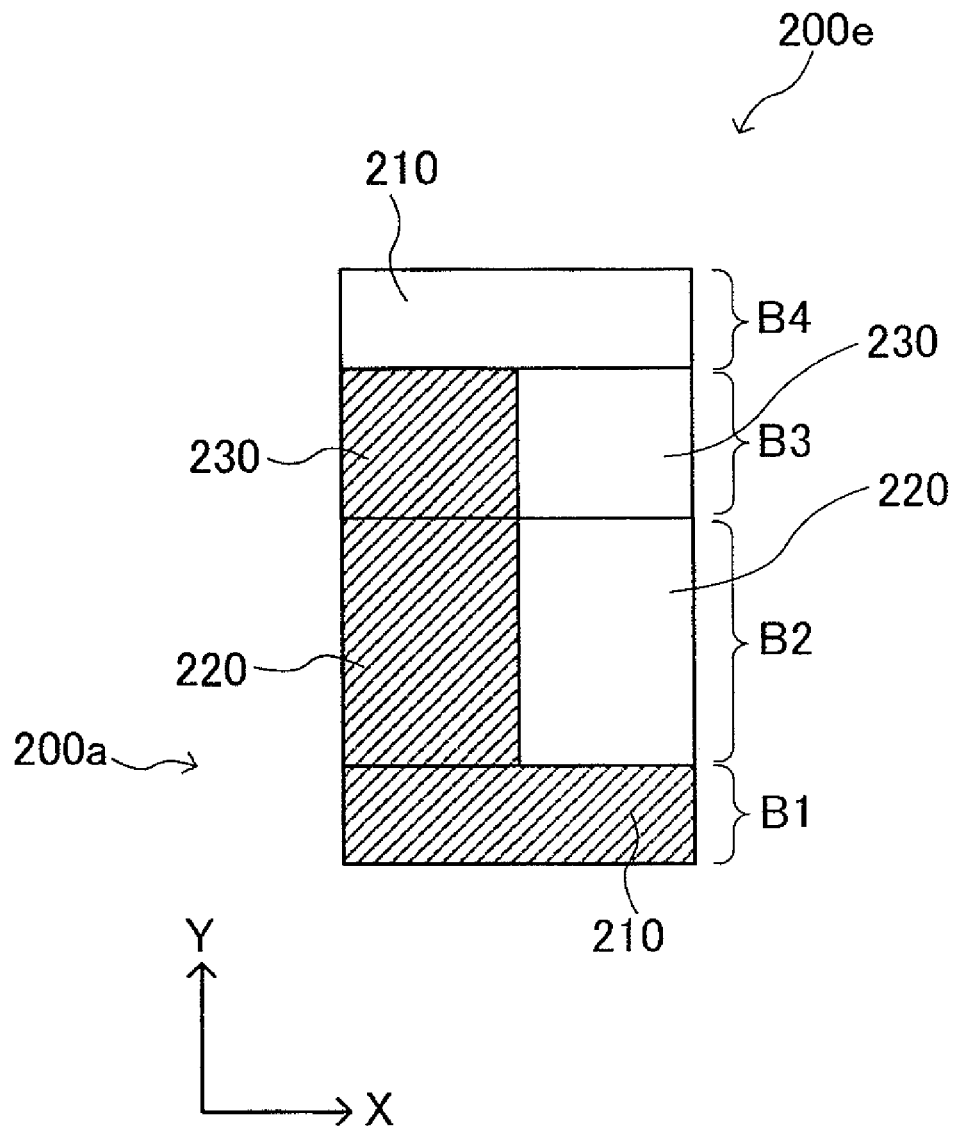
FIG. 17 is a schematic layout diagram showing a combination of the circuit block 200a describe above and a circuit block 200e according to a second modification of the second embodiment.

FIG. 17 is a schematic layout diagram showing a combination of the circuit block 200a describe above and a circuit block 200e according to a second modification of the second embodiment. In FIG. 17, a portion on which a hatching is applied is the circuit block 200a, and a portion on which no hatching is applied is the circuit block 200e. The circuit block 200e is different from the circuit block 200b shown in FIG. 13 in that positions of the comparing circuit 220 and the determining circuit 230 are replaced each other in the Y direction.

To explain a layout of a portion that is constituted by a pair of the circuit blocks 200a and 200e in more detail, the comparing circuit 220 included in the circuit blocks 200a and 200e are arranged in the area B2, and the determining circuit 230 included in the circuit blocks 200a and 200e are arranged in the area B3. The nonvolatile memory element 210 included in the circuit block 200e is arranged in an area B4. If the areas B2 and B3 are defined as one area (the second area in claim 10), the area includes four sub-areas between the area B1 and the area B4, a first sub-area and a second sub-area are arranged in the Y direction, and a third sub-area and a fourth sub-area are arranged in the Y direction. The first sub-area and the third sub-area are arranged in the X direction, and the second sub-area and the fourth sub-area are arranged in the X direction. The comparing circuit 220 included in the circuit block 200a is arranged in the first sub-area, the determining circuit 230 included in the circuit block 200a is arranged in the second sub-area. The comparing circuit 220 included in the circuit block 200e is arranged in the third sub-area, and the determining circuit 230 included in the circuit block 200e is arranged in the fourth area.

Figure 18:
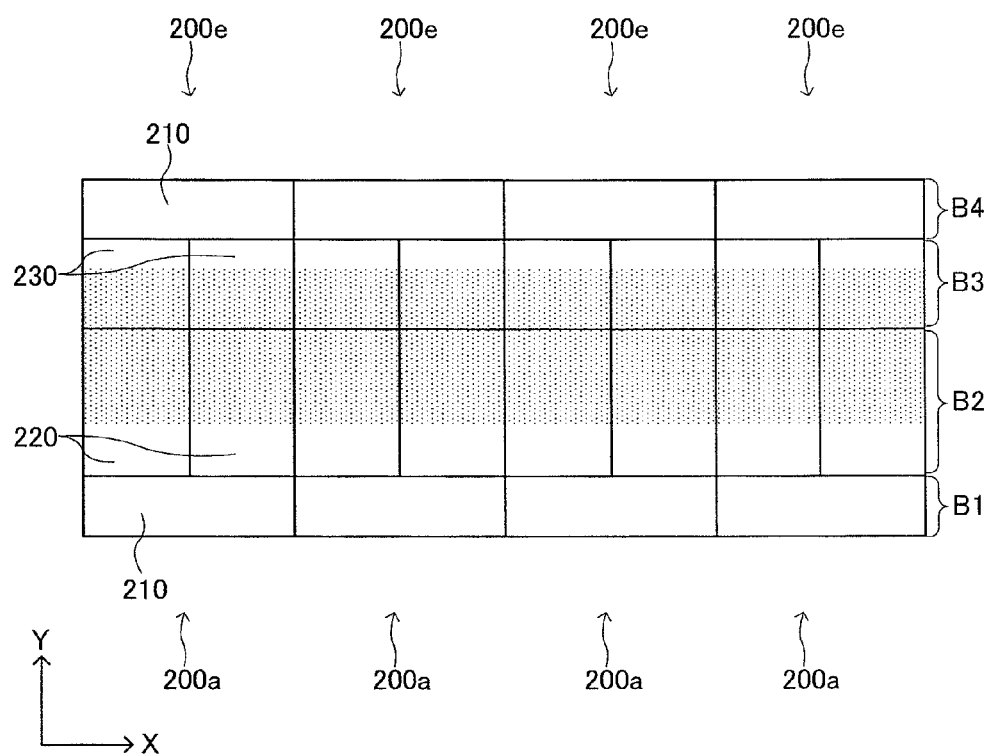
FIG. 18 is a schematic layout diagram showing a plurality of units of the combination of the circuit blocks 200a and 200e, repeatedly arranged in the X direction.

FIG. 18 is a schematic layout diagram showing a plurality of units of the combination of the circuit blocks 200a and 200e, repeatedly arranged in the X direction. With the layout shown in FIG. 18, as shown in a shaded portion, because the outline of the P-channel area becomes virtually a straight line, it is possible to realize a further reduction of the chip area.

Figure 19:
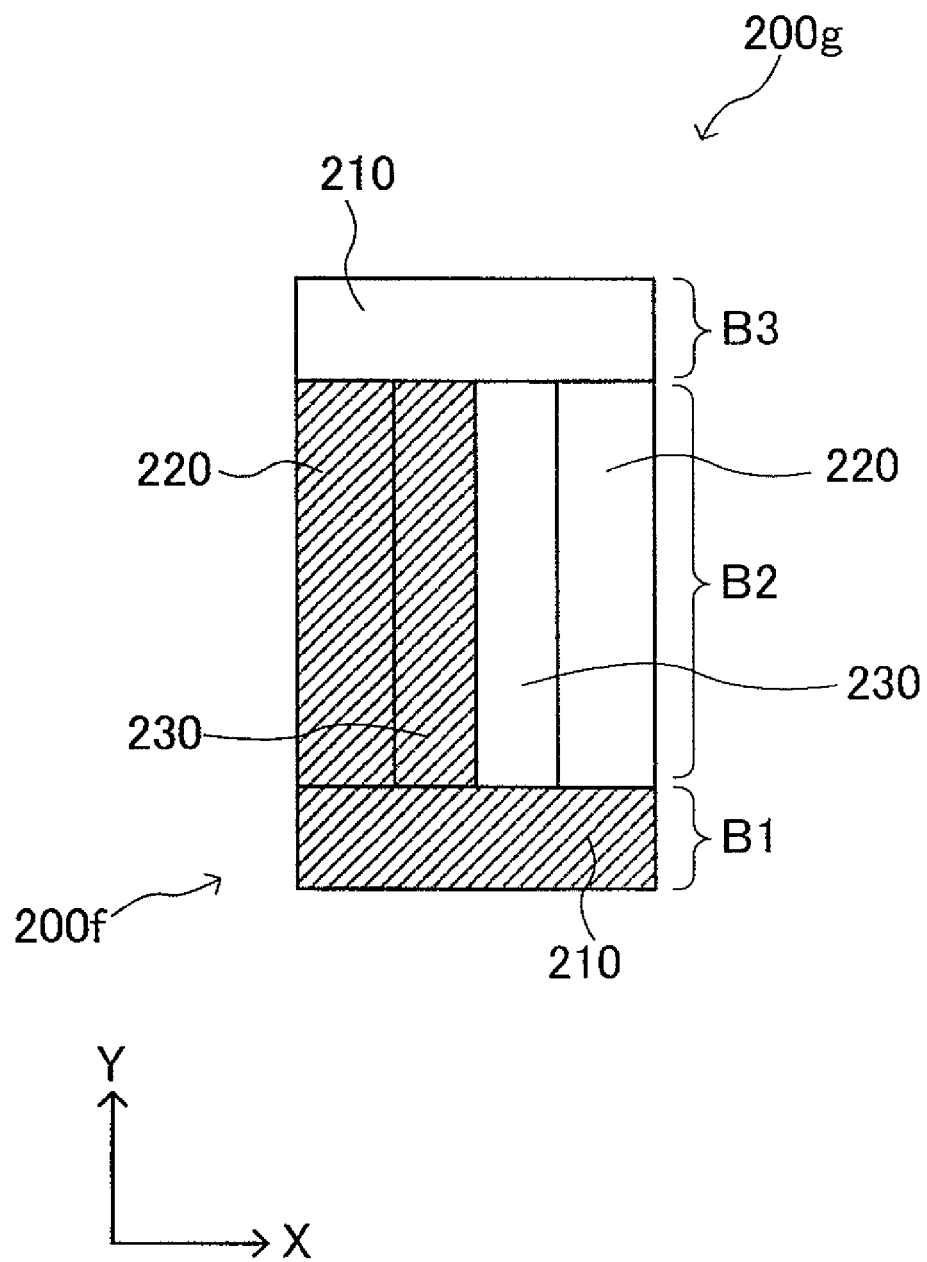
FIG. 19 is a schematic layout diagram showing a combination of circuit blocks 200f and 200g according to a third modification of the second embodiment.

FIG. 19 is a schematic layout diagram showing a combination of circuit blocks 200f and 200g according to a third modification of the second embodiment. In FIG. 19, a portion on which a hatching is applied is the circuit block 200f, and a portion on which no hatching is applied is the circuit block 200g.

An outer shape of the circuit block 200f is an L-shape like the shape of the circuit block 200a shown in FIG. 13. The circuit block 200g has a layout obtained by rotating the circuit block 200f by 180°. As shown in FIG. 19, the comparing circuit 220 and the determining circuit 230 are arranged being adjacent to each other in the X direction in both the circuit blocks 200f and 200g. With this arrangement, all the comparing circuit 220 and the determining circuit 230 included in the circuit blocks 200f and 200g are arranged in the area B2. The nonvolatile memory elements 210 included in the circuit blocks 200f and 200g are arranged in the areas B1 and B3, respectively.

Figure 20:
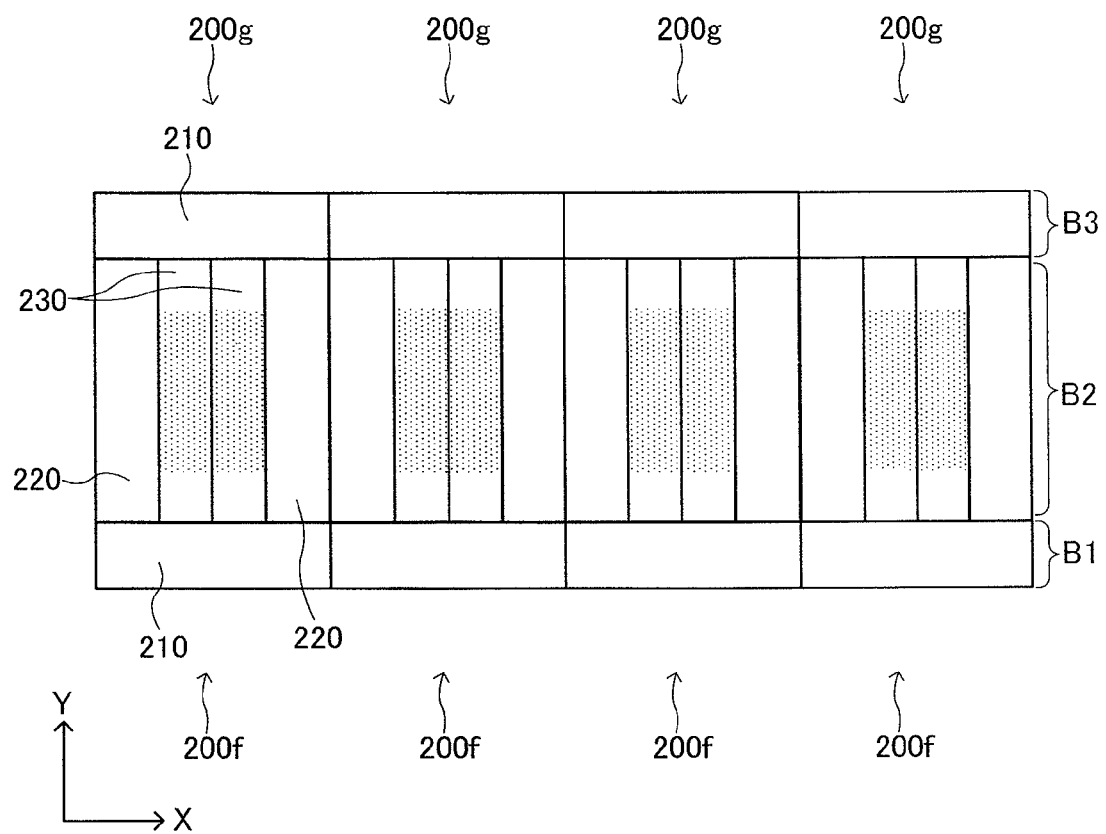
FIG. 20 is a schematic layout diagram showing a plurality of units of the combination of the circuit blocks 200f and 200g, repeatedly arranged in the X direction.

FIG. 20 is a schematic layout diagram showing a plurality of units of the combination of the circuit blocks 200f and 200g, repeatedly arranged in the X direction. With the layout shown in FIG. 20, even when the determining circuit 230 only requires the n-well, as shown in a shaded portion, it is possible to form the P-channel MOS transistors of two determining circuits 230 that are adjacent to each other in the X direction in the same n-well and to make the shape of the n-well a rectangular shape.

As explained above, according to the second embodiment, because the shape of a combination of two circuit blocks is a rectangular shape, even when a plurality of the combinations are arranged in a repeated manner, the layout area never fails to make a shaped block. As a result, it is possible to realize a further reduction of the chip area. However, it is not essential that the shape of the combination of two circuit blocks should be a rectangular shape in the present invention, but as long as a large number of circuit blocks can be arranged with no space between them, the shape of the combination of two circuit blocks can be an irregular shape. An example explained next describes a case that the shape of the combination of two circuit blocks is an irregular shape, but a layout with no wasteful space can be possible as a whole.

Figure 21:
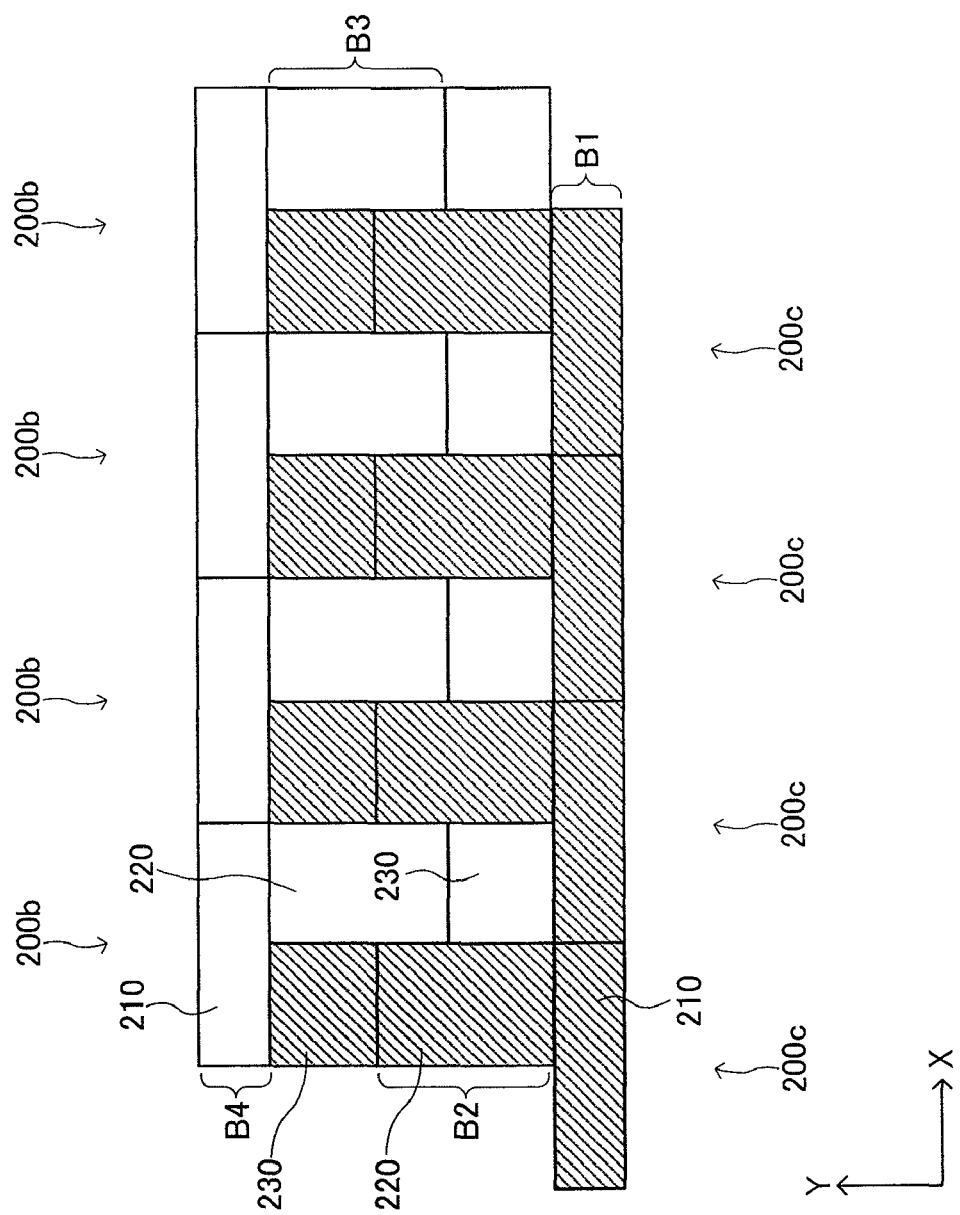
FIG. 21 is a schematic layout diagram showing a plurality of units of the combination of the circuit blocks 200b and 200c, repeatedly arranged in the X direction.

FIG. 21 is a schematic layout diagram showing a plurality of units of the combination of the circuit blocks 200b and 200c, repeatedly arranged in the X direction. In FIG. 21, a portion on which a hatching is applied is the circuit block 200c, and a portion on which no hatching is applied is the circuit block 200b.

As shown in FIG. 21, the shape of the combination of the circuit blocks 200b and 200c is not a rectangular shape. Specifically, coordinates of the nonvolatile memory element 210 included in the circuit block 200b and the nonvolatile memory element 210 included in the circuit block 200c in the X direction do not match each other, but they are shifted from each other by a half pitch. In this manner, in the present example, even when the shape of one combination of two circuit blocks is an irregular shape, it is possible to lay out the circuit blocks with no space between them by arranging the combinations of two circuit blocks in a repeated manner in the X direction. The present invention also includes such a layout.

A third embodiment of the present invention is explained below.

Figure 22:
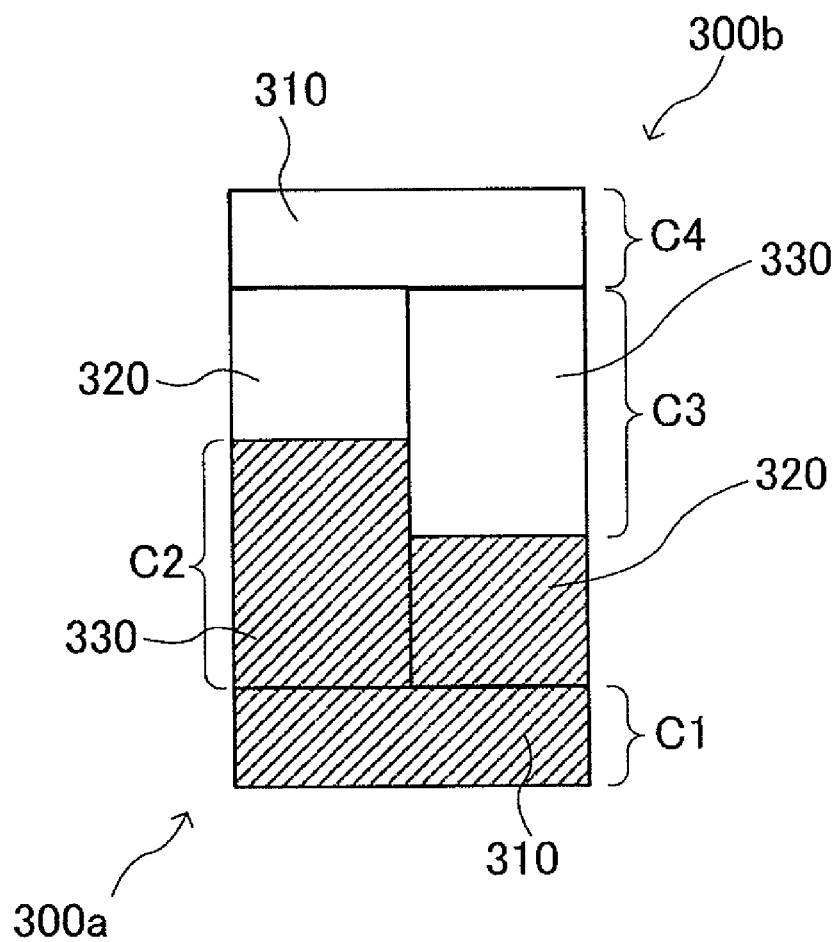
FIG. 22 is a schematic layout diagram of circuit blocks 300a and 300b included in a semiconductor device according to the third embodiment.

FIG. 22 is a schematic layout diagram of circuit blocks 300a and 300b included in a semiconductor device according to the third embodiment. In FIG. 22, a portion on which a hatching is applied is the circuit block 300a, and a portion on which no hatching is applied is the circuit block 300b.

As shown in FIG. 22, each of the circuit blocks 300a and 300b is constituted by a nonvolatile memory element 310, comparing circuit 320, and a determining circuit 330. The circuit configurations of the nonvolatile memory element 310, the comparing circuit 320, and the determining circuit 330 are the same as those of the nonvolatile memory element 110, the comparing circuit 120, and the determining circuit 130 explained in the first embodiment. Therefore, redundant explanations of the circuit configuration will be omitted, and explanations are given below focusing on the layout.

As shown in FIG. 22, in the third embodiment, the nonvolatile memory element 310 of the circuit block 300a is arranged in an area C1. The area C1 has a rectangular shape with the X direction as a long side, and a plurality of nonvolatile memory elements 310 are arranged in the area C1 in the X direction. The comparing circuit 320 and the determining circuit 330 of the circuit block 300a are arranged side by side in an area C2 in the X direction. A length of the area C2 in the X direction is substantially equal to a length of the area C1 in the X direction. On the other hand, lengths of the comparing circuit 320 and the determining circuit 330 in the Y direction are different from each other; thereby the entire shape of the circuit block 300a is an L-shape.

The circuit block 300b has a layout obtained by rotating the circuit block 300a by 180°. Other than this, a configuration of the circuit block 300b is the same as that of the circuit block 300a. Therefore, as shown in FIG. 22, the entire shape of a combination of the two circuit blocks 300a and 300b makes a rectangular shape. The nonvolatile memory element 310 of the circuit block 300b is arranged in an area C4, and the comparing circuit 320 and the determining circuit 330 of the circuit block 300b are arranged in an area C3.

As described above, also in the third embodiment, because the shape of the combination of the two circuit blocks 300a and 300b is a rectangular shape, same effects as those in the second embodiment can be achieved.

Figure 23:
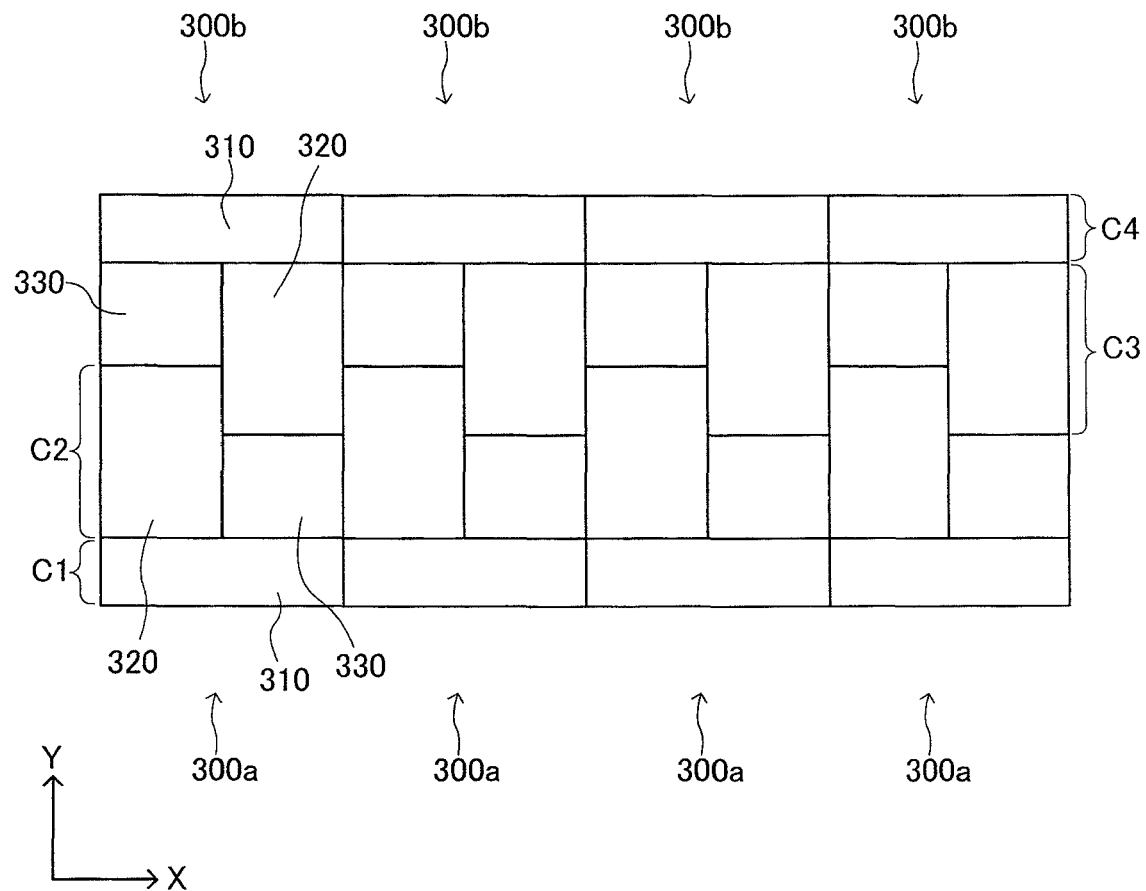
FIG. 23 is a schematic layout diagram showing the combination of the circuit blocks 300a and 300b repeatedly arranged in the X direction.

FIG. 23 is a schematic layout diagram showing the combination of the circuit blocks 300a and 300b repeatedly arranged in the X direction. As shown in FIG. 23, by arranging the combination of the circuit blocks 300a and 300b repeatedly in the X direction, a plurality of areas C1 and C4 can be laid out in the X direction in a continuous manner. Therefore, it is possible to arrange a large number of the nonvolatile memory elements 310, such as fuse elements, along the X direction. Of course, the combination of the circuit blocks 300a and 300b can be repeatedly arranged not only in the X direction but also in the Y direction. In addition, similarly to the example shown in FIG. 16, if a mirror arrangement is applied to circuit blocks that are adjacent to each other in the X direction with respect to a straight line extending in the Y direction, it is possible to realize a further reduction of the chip area.

It is apparent that the present invention is not limited to the above embodiments, but may be modified and changed without departing from the scope and spirit of the invention.

For example, in the above embodiments, a case that the present invention is applied to a redundant circuit has been explained. However, the application target of the present invention is not limited to the redundant circuit. That is, the present invention can be applied to a general semiconductor device that includes a plurality of circuit blocks formed on a semiconductor substrate, in which each of the circuit blocks includes a plurality of unit circuits, a plurality of processing circuits respectively corresponding to the unit circuits, and a common circuit that is commonly allocated to the processing circuits.

Furthermore, in the technical concept of the present invention, the circuit type of the circuit block 100 is not limited to the above embodiments. For example, a circuit type can be taken in which an end of the nonvolatile memory element 110 is connected to the high potential and the common line LINE is initially charged to the ground potential GND. A circuit type of each of the unit circuit, the processing circuit, and the common circuit is no object. In addition, the conduction type of the transistor used in the nonvolatile memory element, the comparing circuit, and the determining circuit described in the above embodiments and the conduction type of the semiconductor substrate can be reversed. Furthermore, the technique of the present invention can be applied to a variety of element structures. Further, the present invention can be applied to a general semiconductor product such as a CPU (Central Processing Unit), an MCU (Micro Control Unit), a DSP (Digital Signal Processor), an ASIC (Application Specific Integrated Circuit), and an ASSP (Application Specific Standard Circuit). Besides, a device to which the present invention is applied can be applied to a semiconductor device such as an SOC (System on Chip), an MCP (Multi Chip Package), and a POP (Package on Package). The transistor used in the present invention can be an FET (Field Effect Transistor) or a bipolar transistor. Other than the MOS (Metal Oxide Semiconductor), it can be applied to various types of FETs such as an MIS (Metal-Insulator Semiconductor) and a TFT (Thin Film Transistor). It can be applied to various FETs such as a transistor. Transistors other than the FET can be also used. A P-channel type transistor or a PMOS transistor is a representative example of a first conduction type transistor, and an N-channel type transistor or an NMOS transistor is a representative example of a second conductor type transistor. In addition, the semiconductor substrate is not limited to a P-type semiconductor substrate, but can be an N-type semiconductor substrate, an SOI (Silicon on Insulator), or other types of semiconductor substrates.

What is claimed is:

1. A semiconductor device comprising a plurality of circuit blocks with a mutually same circuit configuration, wherein each of the circuit blocks includes:
    a first sub-block including a plurality of unit circuits arranged in a first direction;
    a second sub-block including a plurality of processing circuits, each of the processing circuits processing information obtained from an associated one of the unit circuits; and a third sub-block including a common circuit outputting one result from information obtained from the processing circuits, the first sub-block included in a first circuit block among the plurality of circuit blocks is arranged in a first area, and at least a part of the second sub-block included in the first circuit block and either one of at least a part of the third sub-block included in the first circuit block and at least a part of the third sub-block included in a second circuit block among the plurality of circuit blocks are arranged side by side in the first direction in a second area that is located in a second direction that intersects with the first direction with respect to the first area.

2. The semiconductor device as claimed in claim 1, wherein a shape of the second area is a rectangular shape.

3. The semiconductor device as claimed in claim 1, wherein the second and third sub-blocks included in the first circuit block are arranged in the second area, and a length of the first area in the first direction and a length of the second area in the first direction are substantially equal to each other.

4. The semiconductor device as claimed in claim 1, wherein the second sub-block included in the first circuit block and the third sub-block included in the second circuit block are arranged in the second area, and a length of the first area in the first direction and a length of the second area in the first direction are substantially equal to each other.

5. The semiconductor device as claimed in claim 4, wherein a length of the second sub-block included in the first circuit block in the first direction and a length of the third sub-block included in the second circuit block in the first direction are substantially equal to each other.

6. The semiconductor device as claimed in claim 1, wherein the second area includes a first sub-area, a second sub-area, and a third sub-area, the third sub-area is located between the first and second sub-areas, the first to third sub-areas are arranged in the first direction, a part of the processing circuits is arranged in the first sub-area, a remaining part of the processing circuits is arranged in the second sub-area, and the common circuit included in the first circuit block is arranged in the third sub-area.

7. The semiconductor device as claimed in claim 1, wherein the second area includes a first sub-area and a second sub-area arranged in the first direction, the processing circuits are arranged in the first sub-area, and the common circuit included in the first circuit block is arranged in the second sub-area.

8. The semiconductor device as claimed in claim 1, wherein the second area includes a first sub-area and a second sub-area, a boundary between the first and second sub-areas includes a first boundary along the first direction and a second boundary along the second direction, the processing circuits are arranged in the first sub-area, and the common circuit included in the first circuit block is arranged in the second sub-area.

9. The semiconductor device as claimed in claim 1, wherein the second sub-block included in the first circuit block and the third sub-block included in the second circuit block are arranged in the second area, the third sub-block included in the first circuit block and the second sub-block included in the second circuit block are arranged in a third area that is provided in a manner such that the second area is sandwiched between the first and third areas, and the first sub-block included in the second circuit block is arranged in a fourth area that is provided in a manner such that the third area is sandwiched between the second and fourth areas.

10. The semiconductor device as claimed in claim 1, wherein the second and third sub-blocks included in each of the first circuit block and the second circuit block are arranged in the second area, the first sub-block included in the second circuit block is arranged in a third area that is provided in a manner such that the second area is sandwiched between the first and third areas, the second area includes a first sub-area and a second sub-area arranged in the second direction and a third sub-area and a fourth sub-area arranged in the second direction, the first and third sub-areas are arranged side by side in the first direction, the second and fourth sub-areas are arranged side by side in the first direction, the second sub-block included in the first circuit block is arranged in the first sub-area, the third sub-block included in the first circuit block is arranged in the second sub-area, the second sub-block included in the second circuit block is arranged in the third sub-area, and the third sub-block included in the second circuit block is arranged in the fourth sub-area.

11. The semiconductor device as claimed in claim 1, wherein the second and third sub-blocks included in the first circuit block and the second and third sub-blocks included in the second circuit block are arranged in the second area, and the first sub-block included in the second circuit block is arranged in a third area that is provided in a manner such that the second area is sandwiched between the first and third areas.

12. The semiconductor device as claimed in claim 1, wherein at least a part of the processing circuits is arranged in the second area in the second direction.

13. The semiconductor device as claimed in claim 1, wherein the second and third sub-blocks included in the first circuit block are arranged in the second area, the second and third sub-blocks included in the second circuit block are arranged in a third area that is provided in a manner such that the second area is sandwiched between the first and third areas, the first sub-block included in the second circuit block is arranged in a fourth area that is provided in a manner such that the third area is sandwiched between the second and fourth areas, the second sub-block arranged in the second area and the second sub-block arranged in the third area face each other in the second direction via a boundary of the second and third areas along the first direction, and the third sub-block arranged in the second area and the third sub-block arranged in the third area face each other in the second direction via a boundary of the second and third areas along the first direction.

14. The semiconductor device as claimed in claim 1, wherein the second sub-blocks and the third sub-blocks included in two circuit blocks that are adjacent to each other in the first direction among the circuit blocks make a mirror arrangement with respect to a boundary line between the two circuit blocks.

15. The semiconductor device as claimed in claim 1, wherein
two circuit blocks that are adjacent to each other in the second direction among the circuit blocks constitute a pair block, and
the pair block is repeatedly arranged in at least one of the first direction and the second direction.

16. The semiconductor device as claimed in claim 1, wherein a transistor of a first conductive type included in the second sub-block and a transistor of the first conductive type included in the third sub-block are formed in a same well.

17. The semiconductor device as claimed in claim 1, wherein a transistor of a first conductive type included in the first sub-block and a transistor of the first conductive type included in either one of the second sub-block and the third sub-block are formed in a same well.

18. The semiconductor device as claimed in claim 1, wherein
each of the unit circuits includes a nonvolatile memory element that stores therein information in a nonvolatile manner,
each of the processing circuits includes a comparing circuit that detects a match of the information stored in the associated one of the unit circuits and a supplied bit signal, and
the common circuit includes a determining circuit that determines whether all processing circuits included in a same circuit block detect a match of the information and the supplied bit signal.

19. A semiconductor device comprising a plurality of circuit blocks including at least a first circuit block and a second circuit block, wherein
each of the circuit blocks includes:
a first sub-block including a plurality of unit circuits arranged in a first direction;
a second sub-block including a plurality of processing circuits, each of the processing circuits processing information obtained from an associated one of the unit circuits; and
a third sub-block including a common circuit outputting one result from information obtained from the processing circuits,
the first sub-block included in the first circuit block is arranged in a first area,
the first sub-block included in the second circuit block is arranged in a second area that is located in a second direction that intersects with the first direction as viewed from the first area,
the second and third sub-blocks included in each of the first and second circuit blocks are arranged in a third area that is located between the first and second areas,
the third area includes a first sub-area and a second sub-area arranged in either one of the first direction and the second direction and a third sub-area and a fourth sub-area arranged in either one of the first direction and the second direction,
the second and third sub-blocks included in each of the first and second circuit blocks are respectively arranged in the first to fourth sub-areas different from each other,
a shape of the third area is a rectangular shape, and a length of the third area in the first direction and lengths of the first and second areas in the first direction are substantially equal to each other.

20. The semiconductor device as claimed in claim 19, wherein
the first and second sub-areas are arranged in the first direction,
the third and fourth sub-areas are arranged in the first direction,
the second and third sub-blocks included in the first circuit block are arranged in the first and second sub-areas, respectively, and
the second and third sub-blocks included in the second circuit block are arranged in the third and fourth sub-areas, respectively.

21. The semiconductor device as claimed in claim 19, wherein
the first and second sub-areas are arranged in the second direction,
the third and fourth sub-areas are arranged in the second direction,
the second and third sub-blocks included in the first circuit block are arranged in the first and second sub-areas, respectively, and
the second and third sub-blocks included in the second circuit block are arranged in the third and fourth sub-areas, respectively.

22. The semiconductor device as claimed in claim 19, wherein
the circuit blocks further include:
a third circuit block that is arranged being adjacent to the first circuit block in the first direction; and
a fourth circuit block that is arranged being adjacent to the second circuit block in the first direction and being adjacent to the third circuit block in the second direction, and
the second and third sub-blocks included in each of the first and second circuit blocks and the second and third sub-blocks included in each of the third and fourth circuit blocks make a mirror arrangement with respect to a straight line extending in the second direction.

23. A semiconductor device comprising a plurality of circuit blocks including at least a first circuit block and a second circuit block arranged in a first direction, wherein
each of the circuit blocks includes:
a first sub-block including a plurality of unit circuits arranged in a first direction;
a second sub-block including a plurality of processing circuits, each of the processing circuits processing information obtained from an associated one of the unit circuits; and
a third sub-block including a common circuit outputting one result from information obtained from the processing circuits,
the first sub-block included in each of the first and second circuit blocks is arranged in a first area in the first direction,
the second sub-block included in the first circuit block and the second sub-block included in the second circuit block are arranged in a second area and a third area, respectively, in the first direction, the second area and the third area being located in a second direction that intersects with the first direction as viewed from the first area, the third sub-block included in each of the first and second circuit blocks is arranged in the first direction in a fourth area that is sandwiched between the second and third areas, a shape of a combined area obtained by combining the second to fourth areas is a rectangular shape, and a length of the combined area in the first direction and a length of the first area in the first direction are substantially equal to each other.

* * * * *